(12) United States Patent
Li et al.

(10) Patent No.: US 11,903,252 B2
(45) Date of Patent: Feb. 13, 2024

(54) DISPLAY PANEL AND ELECTRONIC DEVICE

(71) Applicants: Hefei BOE Joint Technology Co., Ltd., Hefei (CN); BOE Technology Group Co., Ltd., Beijing (CN)

(72) Inventors: Meng Li, Beijing (CN); Ying Wang, Beijing (CN)

(73) Assignees: Hefei BOE Joint Technology Co., Ltd., Beijing (CN); BOE Technology Group, Co., Ltd., Hefei (CN)

( * ) Notice: Subject to any disclaimer, the term of this patent is extended or adjusted under 35 U.S.C. 154(b) by 528 days.

(21) Appl. No.: 17/270,596

(22) PCT Filed: May 15, 2020

(86) PCT No.: PCT/CN2020/090651
§ 371 (c)(1),
(2) Date: Feb. 23, 2021

(87) PCT Pub. No.: WO2021/227063
PCT Pub. Date: Nov. 18, 2021

(65) Prior Publication Data
US 2021/0399073 A1 Dec. 23, 2021

(51) Int. Cl.
*G09G 3/30* (2006.01)
*H10K 59/121* (2023.01)
(Continued)

(52) U.S. Cl.
CPC ..... *H10K 59/1213* (2023.02); *H10K 59/1216* (2023.02); *H10K 59/131* (2023.02);
(Continued)

(58) Field of Classification Search
CPC ......... G09G 3/3233; G09G 2300/0426; G09G 2300/0452; G09G 2310/0262;
(Continued)

(56) References Cited

U.S. PATENT DOCUMENTS 9,035,976 B2 * 5/2015 Lee ........................... G09G 5/10
345/691
9,135,862 B2 * 9/2015 Park ..................... G09G 3/3291
(Continued)

FOREIGN PATENT DOCUMENTS

EP 3993055 A1 5/2022
EP 3996074 A1 5/2022
(Continued)

OTHER PUBLICATIONS

Extended European Search Report, for European Patent Application No. 20900688.1, dated Oct. 18, 2022, 14 pages.

*Primary Examiner* — Joe H Cheng
(74) *Attorney, Agent, or Firm* — Westman, Champlin & Koehler, P.A.

(57) ABSTRACT

The present disclosure provides a display panel and an electronic device. The display panel includes: a base substrate; a pixel arranged on the base substrate, wherein the pixel includes a plurality of sub-pixel drive circuits sequentially arranged in the first direction in the display area, each of the sub-pixel drive circuits includes a switching transistor, a detection transistor and a storage capacitor, the switching transistor and the detection transistor are respectively located on both sides of the storage capacitor in a second direction; a first gate line configured to provide a first scanning signal to the plurality of sub-pixel drive circuits; and a second gate line configured to provide a second scanning signal to the plurality of sub-pixel drive circuits.

19 Claims, 13 Drawing Sheets

(51) Int. Cl.
    *H10K 59/131*     (2023.01)
    *H10K 71/00*     (2023.01)
    *H01L 27/12*     (2006.01)
    *H10K 59/12*     (2023.01)

(52) U.S. Cl.
    CPC .......... *H10K 71/00* (2023.02); *H01L 27/1255* (2013.01); *H10K 59/1201* (2023.02)

(58) Field of Classification Search
    CPC ... G09G 2320/0209; G09G 2320/0295; H10K 59/1201; H10K 59/121; H10K 59/1213; H10K 59/1216; H10K 59/131; H10K 71/00; H01L 27/124; H01L 27/1255
    See application file for complete search history.

(56) References Cited

U.S. PATENT DOCUMENTS

| | | | | |
|---|---|---|---|---|
| 9,799,270 | B2 * | 10/2017 | Li | G09G 3/3233 |
| 10,008,159 | B2 * | 6/2018 | Song | G09G 3/3233 |
| 10,192,935 | B2 * | 1/2019 | Shim | H10K 59/1315 |
| 10,276,096 | B2 * | 4/2019 | Li | G09G 3/3266 |
| 10,600,361 | B2 * | 3/2020 | Qian | G09G 3/3233 |
| 10,699,643 | B2 * | 6/2020 | Yuan | G09G 3/3225 |
| 11,482,582 | B2 | 10/2022 | Li et al. | |
| 2014/0292342 | A1 * | 10/2014 | Chaji | G09G 3/32 324/414 |
| 2015/0170565 | A1 * | 6/2015 | Hong | G09G 3/3225 345/212 |
| 2017/0193876 | A1 | 7/2017 | Choi et al. | |
| 2018/0151132 | A1 * | 5/2018 | Lee | G09G 3/3406 |
| 2022/0013067 | A1 * | 1/2022 | Li | G09G 3/3233 |
| 2022/0013610 | A1 | 1/2022 | Li et al. | |
| 2022/0028954 | A1 | 1/2022 | Li et al. | |
| 2022/0123056 | A1 | 4/2022 | Li et al. | |
| 2022/0123073 | A1 | 4/2022 | Li et al. | |
| 2022/0285476 | A1 | 9/2022 | Li et al. | |

FOREIGN PATENT DOCUMENTS

| | | |
|---|---|---|
| EP | 4006986 A1 | 6/2022 |
| EP | 4012774 A1 | 6/2022 |
| WO | 2021227744 A1 | 11/2021 |

* cited by examiner

DISPLAY PANEL AND ELECTRONIC DEVICE

CROSS-REFERENCE TO RELATED APPLICATION

This Application is a Section 371 National Stage Application of International Application No. PCT/CN2020/090651, filed 15 May 2020, which has not yet published, in Chinese, the content of which is hereby incorporated by reference in its entirety.

TECHNICAL FIELD

The present disclosure relates to a field of display technology, and in particular to a display panel and an electronic device.

BACKGROUND

Transparent display, as a new display technology, allows an observer to see a background behind a display screen through the display screen. This novel display effect broadens application fields of the display, and thus has been widely concerned.

SUMMARY

Some embodiments of the present disclosure provide a display panel, including: a base substrate; a pixel arranged on the base substrate, including a light-transmitting area and a display area arranged side by side in a first direction parallel to the base substrate, wherein the pixel includes a plurality of sub-pixel drive circuits sequentially arranged in the first direction in the display area, each of the sub-pixel drive circuits includes a switching transistor, a detection transistor and a storage capacitor, the switching transistor and the detection transistor are respectively located on both sides of the storage capacitor in a second direction perpendicular to the first direction and parallel to the base substrate; a first gate line configured to provide a first scanning signal to the plurality of sub-pixel drive circuits; and a second gate line configured to provide a second scanning signal to the plurality of sub-pixel drive circuits, wherein the first gate line and the second gate line are respectively located on both sides of the light-transmitting area, the first gate line is located on a side of the switching transistor away from the storage capacitor, the second gate line is located on a side of the detection transistor away from the storage capacitor, and between two ends of the pixel in the first direction, at least one of the first gate line and the second gate line is linear and extends in the first direction.

In some embodiments, the switching transistor is located in a region of the corresponding sub-pixel drive circuit close to the first gate line and includes a drain electrode, a gate electrode and a source electrode arranged sequentially away from the first gate line in the second direction, the first gate line is electrically connected to the gate electrode of the switching transistor, and between the two ends of the pixel in the first direction, the first gate line is linear and extends in the first direction.

In some embodiments, the gate electrode of the switching transistor extends in the first direction and includes a connection end and a free end, each of the plurality of sub-pixel drive circuits further includes a first gate connection line extending in the second direction, the first gate connection line includes a first end electrically connected to the first gate line and a second end electrically connected to the connection end of the gate electrode of the switching transistor.

In some embodiments, the gate electrode of the switching transistor, the first gate connection line and the first gate line are formed as an integral structure.

In some embodiments, the plurality of sub-pixel drive circuits include a first sub-pixel drive circuit, a second sub-pixel drive circuit, a third sub-pixel drive circuit and a fourth sub-pixel drive circuit sequentially arranged in the first direction; the display panel further includes a first data line, a second data line, a third data line and a fourth data line extending in the second direction; the first data line is arranged on a side of the first sub-pixel drive circuit close to the second sub-pixel drive circuit and is configured to provide a first data signal to the first sub-pixel drive circuit; the second data line is arranged on a side of the second sub-pixel drive circuit close to the first sub-pixel drive circuit and is configured to provide a second data signal to the second sub-pixel drive circuit; the third data line is arranged on a side of the third sub-pixel drive circuit close to the fourth sub-pixel drive circuit and is configured to provide a third data signal to the third sub-pixel drive circuit; and the fourth data line is arranged on a side of the fourth sub-pixel drive circuit close to the third sub-pixel drive circuit and is configured to provide a fourth data signal to the four sub-pixel drive circuit.

In some embodiments, the free end of the gate electrode of the switching transistor of the first sub-pixel drive circuit is closer to the first data line than the connection end thereof; and the drain electrode of the switching transistor of the first sub-pixel drive circuit is electrically connected to the first data line and is closer to the first data line than the first gate connection line of the first sub-pixel drive circuit.

In some embodiments, the free end of the gate electrode of the switching transistor of the second sub-pixel drive circuit is closer to the second data line than the connection end thereof; and the drain electrode of the switching transistor of the second sub-pixel drive circuit is electrically connected to the second data line and is closer to the second data line than the first gate connection line of the second sub-pixel drive circuit.

In some embodiments, the free end of the gate electrode of the switching transistor of the third sub-pixel drive circuit is closer to the third data line than the connection end thereof; and the drain electrode of the switching transistor of the third sub-pixel drive circuit is electrically connected to the third data line and is closer to the third data line than the first gate connection line of the third sub-pixel drive circuit.

In some embodiments, the free end of the gate electrode of the switching transistor of the fourth sub-pixel drive circuit is closer to the fourth data line than the connection end thereof; and the drain electrode of the switching transistor of the fourth sub-pixel drive circuit is electrically connected to the fourth data line and is closer to the fourth data line than the first gate connection line of the fourth sub-pixel drive circuit.

In some embodiments, the detection transistor is located in a region of the corresponding sub-pixel drive circuit close to the second gate line and includes a drain electrode, a gate electrode and a source electrode arranged sequentially away from the second gate line in the second direction; the second gate line is electrically connected to the gate electrode of the detection transistor, and between the two ends of the pixel in the first direction, the second gate line is linear and extends in the first direction.

In some embodiments, the gate electrode of the detection transistor extends in the first direction and includes a connection end and a free end, each of the plurality of sub-pixel drive circuits further includes a second gate connection line extending in the second direction, the second gate connection line includes a first end electrically connected to the second gate line and a second end electrically connected to the connection end of the gate electrode of the detection transistor.

In some embodiments, the gate electrode of the detection transistor, the second gate connection line and the second gate line are formed as an integral structure.

In some embodiments, the plurality of sub-pixel drive circuits includes a first sub-pixel drive circuit, a second sub-pixel drive circuit, a third sub-pixel drive circuit and a fourth sub-pixel drive circuit sequentially arranged in the first direction; and the display panel further includes a detection line extending in the second direction and a detection connection line extending in the first direction; the detection line is located between the second sub-pixel drive circuit and the third sub-pixel drive circuit, and the second sub-pixel drive circuit is electrically connected to the drain electrode of the detection transistor of each of the sub-pixel drive circuits through the detection connection line.

In some embodiments, the free end of the gate electrode of the detection transistor of the first sub-pixel drive circuit is closer to the detection line than the connection end thereof; and the drain electrode of the detection transistor of the first sub-pixel drive circuit is closer to the detection line than the second gate connection line of the first sub-pixel drive circuit.

In some embodiments, the free end of the gate electrode of the detection transistor of the second sub-pixel drive circuit is closer to the detection line than the connection end thereof; and the drain electrode of the detection transistor of the second sub-pixel drive circuit is closer to the detection line than the second gate connection line of the second sub-pixel drive circuit.

In some embodiments, the free end of the gate electrode of the detection transistor of the third sub-pixel drive circuit is closer to the detection line than the connection end thereof; and the drain electrode of the detection transistor of the third sub-pixel drive circuit is closer to the detection line than the second gate connection line of the third sub-pixel drive circuit.

In some embodiments, the free end of the gate electrode of the detection transistor of the fourth sub-pixel drive circuit is closer to the detection line than the connection end thereof; and the drain electrode of the detection transistor of the fourth sub-pixel drive circuit is closer to the detection line than the second gate connection line of the fourth sub-pixel drive circuit.

In some embodiments, the first sub-pixel drive circuit, the second sub-pixel drive circuit, the third sub-pixel drive circuit and the fourth sub-pixel drive circuit are arranged sequentially away from the light-transmitting area; the display panel further includes a first power line and a second power line extending in the second direction; and the first power line is located on a side of the fourth sub-pixel drive circuit away from the light-transmitting area, and the second power line is located on a side of the first sub-pixel drive circuit close to the light-transmitting area.

In some embodiments, in the first sub-pixel drive circuit, the first gate connection line and the second gate connection line are both located at an edge of the first sub-pixel drive circuit close to the second power line.

In some embodiments, in the second sub-pixel drive circuit, the first gate connection line is located at an edge of the second sub-pixel drive circuit close to the first power line, and the second gate connection line is located at an edge of the second sub-pixel drive circuit close to the second power line.

In some embodiments, in the third sub-pixel drive circuit, the first gate connection line is located at an edge of the third sub-pixel drive circuit close to the second power line, and the second gate connection line is located at an edge of the third sub-pixel drive circuit close to the first power line.

In some embodiments, in the fourth sub-pixel drive circuit, the first gate connection line and the second gate connection line are both located at an edge of the fourth sub-pixel drive circuit close to the first power line.

In some embodiments, the light-transmitting area is surrounded by the first gate line, the second gate line, the second power line, and a first power line corresponding to another pixel adjacent to the pixel.

In some embodiments, in each of the sub-pixel drive circuits, the first gate connection line has a length smaller than a length of the second gate connection line.

Some embodiments of the present disclosure provide an electronic device, including the display panel according to the above-mentioned embodiments.

BRIEF DESCRIPTION OF THE DRAWINGS

By reading the detailed description of the non-limiting embodiments with reference to the following drawings, other features, objectives and advantages of the present disclosure will become more apparent.

DETAILED DESCRIPTION

Figure 1:
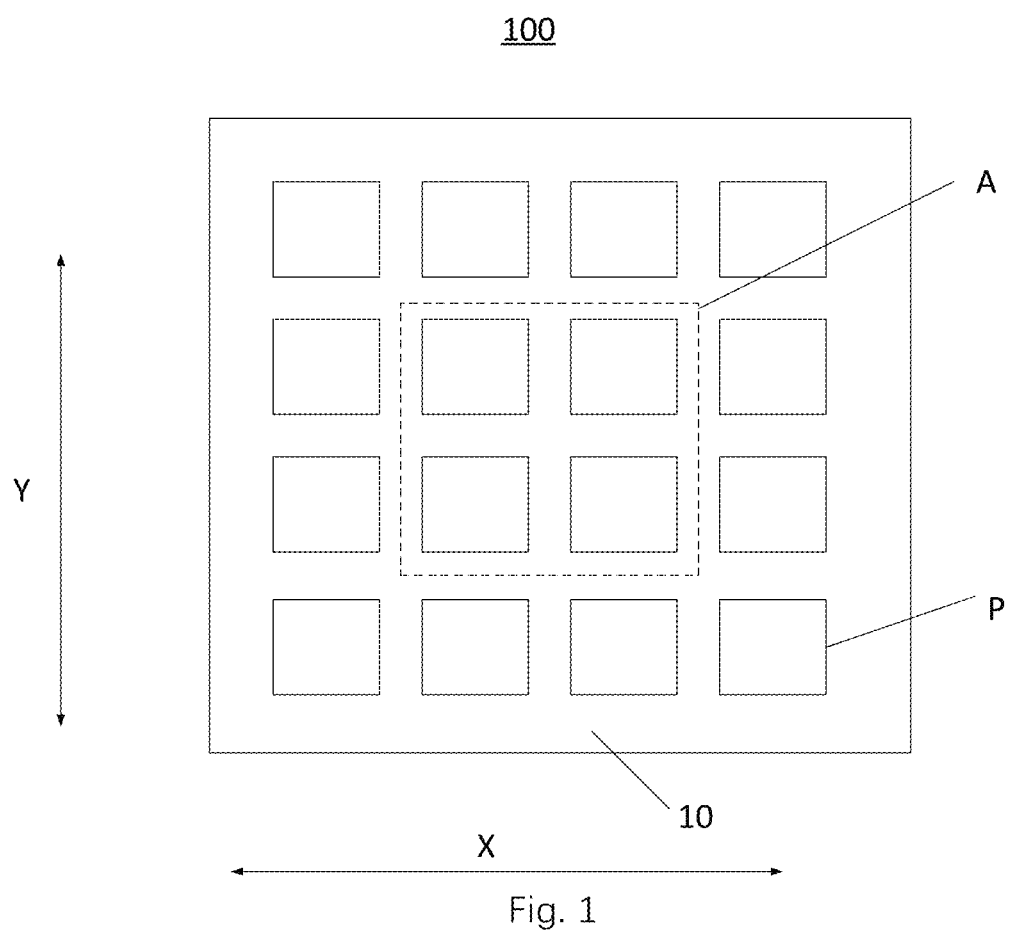
FIG. 1 shows a schematic plan view of a transparent display panel according to some embodiments of the present disclosure.

The present disclosure will be further described in detail below with reference to the drawings and embodiments. It can be understood that the specific embodiments described here are only used to explain the related invention, but not to limit the present disclosure. In addition, it should be noted that, for ease of description, only the parts related to the present disclosure are shown in the drawings.

It should be noted that, in the case of no conflict, the embodiments in the present disclosure and the features in the embodiments may be combined with each other.

In addition, in the following detailed description, for the convenience of explanation, many specific details are set forth to provide a comprehensive understanding of the embodiments of the present disclosure. Obviously, however, one or more embodiments may also be implemented without these specific details.

It should be understood that, although the terms first, second, and so on may be used herein to describe different elements, these elements should not be limited by these terms. These terms are only used to distinguish one element from another. For example, without departing from the scope of exemplary embodiments, a first element may be named as a second element, and similarly, the second element may be named as the first element. The term "and/or" as used here includes any and all combinations of one or more related listed items.

It should be understood that when an element or layer is referred to as being "formed on" another element or layer, the element or layer may be directly or indirectly formed on the other element or layer. That is, for example, an intermediate element or an intermediate layer may be present. In contrast, when an element or layer is referred to as being "directly formed on" another element or layer, no intermediate elements or layers are present. Other terms used to describe the relationship between elements or layers (for example, "between" and "directly between", "adjacent to" and "directly adjacent to", etc.) should be interpreted in a similar manner.

The terms used herein are only for the purpose of describing specific embodiments, and are not intended to limit the embodiments. As used herein, unless otherwise specified in the context, a singular form is also intended to include a plural form. It should also be understood that when the terms "comprising" and/or "including" are used herein, it means that the described features, wholes, steps, operations, elements and/or components are present, but do not exclude the presence or addition of one or more other features, wholes, steps, operations, elements, components and/or combinations thereof.

In the present disclosure, unless otherwise specified, the expressions "located in the same layer" and "arranged in the same layer" generally mean that a first component and a second component may be formed of the same material and may be formed by the same patterning process. The expressions "located in different layers" and "arranged in different layers" generally indicate that the first component and the second component are formed by different patterning processes.

In the following embodiments of the present disclosure, an OLED display panel is illustrated by way of example in describing the transparent display panel. Those skilled in the art may understand that the transparent display panel may also be other types of display panels, such as a PLED display panel, a quantum dot display panel, and the like.

Some embodiments of the present disclosure provide a display panel, specifically a transparent display panel. FIG. 1 shows a schematic plan view of a transparent display panel according to some embodiments of the present disclosure. As shown in FIG. 1, a transparent display panel 100 includes a base substrate 10 and a plurality of pixels P arranged in an array on the base substrate 10. A row direction of the pixel array is, for example, a first direction X, and a column direction is, for example, a second direction Y. The first direction X and the second direction Y are perpendicular to each other.

Figure 2:
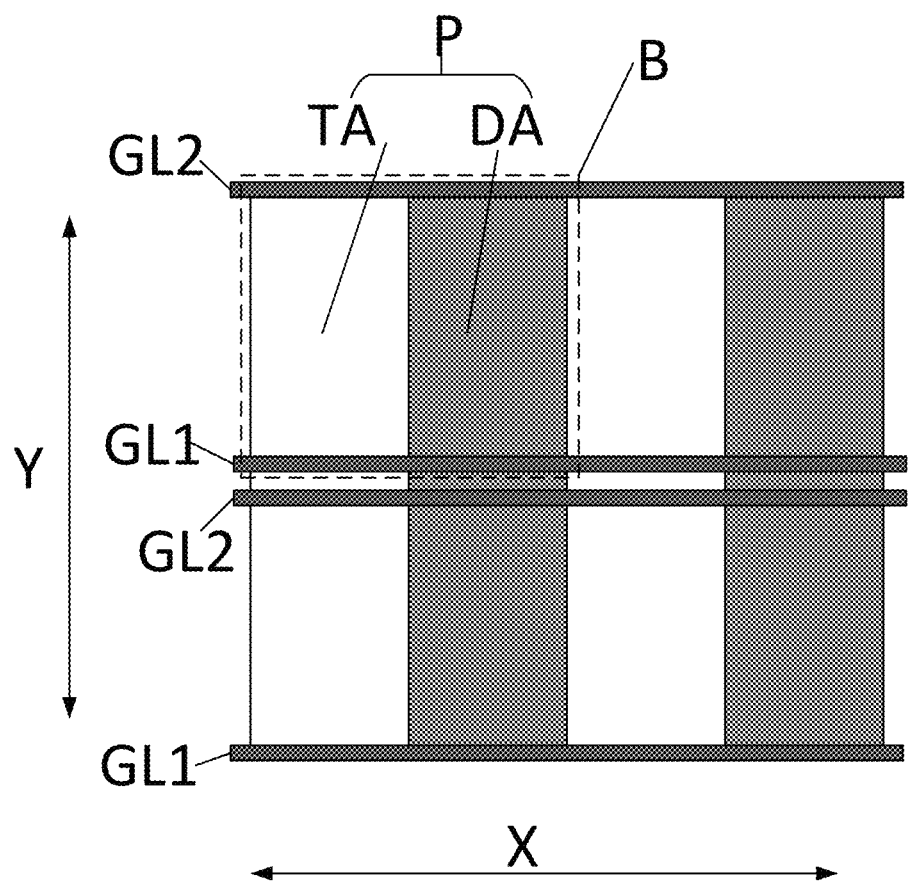
FIG. 2 shows a schematic enlarged view of area A in FIG. 1.

FIG. 2 shows a schematic enlarged view of area A in FIG. 1. Only four pixels P are shown in FIG. 2. As shown in FIG. 2, each pixel P includes a light-transmitting area TA and a display area DA. In each pixel P, the light-transmitting area TA and the display area DA are arranged side by side in the first direction. In this embodiment, as shown in FIG. 2, the light-transmitting area TA and the display area DA are arranged left and right in each pixel P, and the light-transmitting area TA is located on the left side of the display area DA. Those skilled in the art may understand that, in other embodiments, the light-transmitting area TA may be located on the right side of the display area DA. In some embodiments, it is possible that in some pixels, the light-transmitting area TA is located on the left side of the display area DA, and in the other pixels, the light-transmitting area TA is located on the right side of the display area DA.

Figure 3:
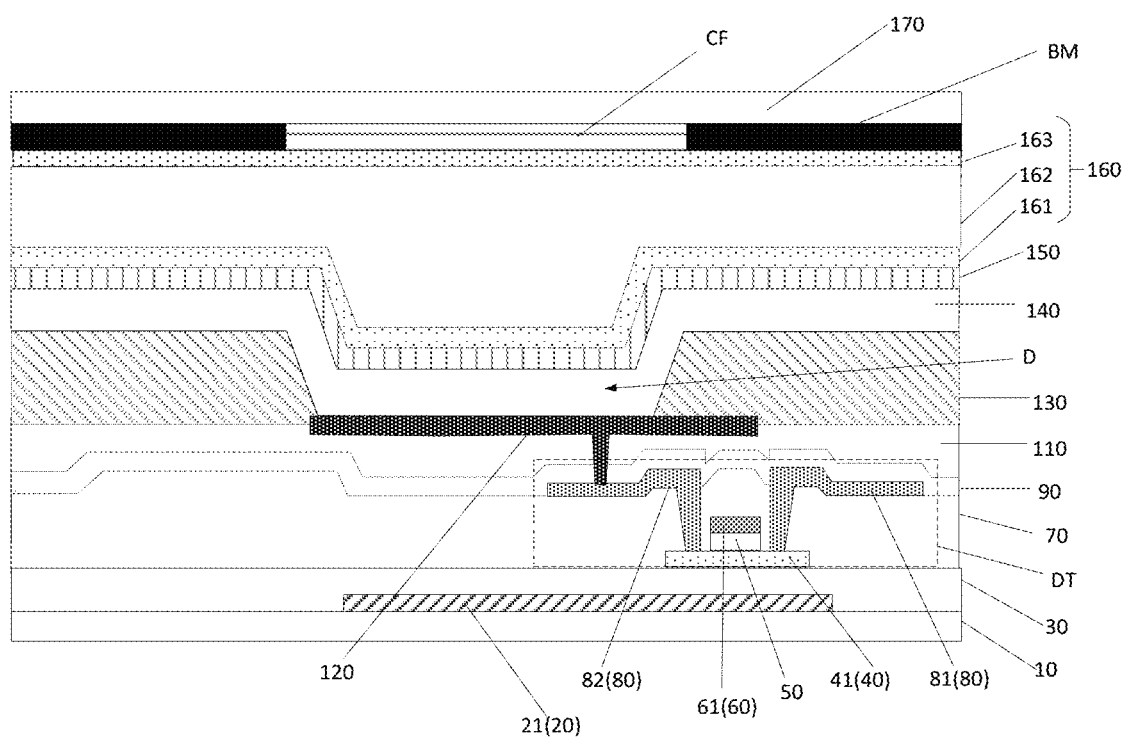
FIG. 3 shows a schematic cross-sectional view of a display area of a single pixel of the transparent display panel according to some embodiments of the present disclosure.

FIG. 3 shows a schematic cross-sectional view of the display area of the pixel according to some embodiments of the present disclosure. As shown in FIG. 3, in the display area DA of the pixel P, a first metal layer 20, a first insulating layer 30, an active material layer 40, a second insulating layer 50, a second metal layer 60, a third insulating layer 70, a third metal layer 80, a fourth insulating layer 90, a fifth insulating layer 110, a first electrode layer 120, a pixel defining layer 130, a luminescent material layer 140, a second electrode layer 150, a packaging layer 160, a color filter layer CF, a black matrix layer BM and a packaging cover plate 170 are sequentially arranged on the base substrate 10. In some embodiments, the fourth insulating layer 90 may be omitted.

The base substrate 10 and the packaging cover plate 170 are made of, for example, a glass material with good light transmission characteristics. The first insulating layer 30 is, for example, a buffer layer, which may also be referred to as a buffer layer 30 herein. The second insulating layer 50 is, for example, a gate insulating layer, which may also be referred to as a gate insulating layer 50 herein. The third insulating layer 70 is, for example, an interlayer dielectric layer, which may also be referred to as an interlayer dielectric layer 70 herein. The fourth insulating layer 90 is, for example, a passivation layer, which may also be referred to as a passivation layer 90 herein. The fifth insulating layer 110 is, for example, a planarization layer, which may also be referred to as a planarization layer 110 herein. The planarization layer 110 is formed of an organic material such as resin, and the pixel defining layer 130 is also formed of an organic material. In some embodiments, since the planarization layer 110 itself has an insulating effect, the passivation layer 90 may not be provided.

It should be understood that FIG. 3 schematically shows the cross-sectional layer structure of a single sub-pixel in the pixel display area, which is only used to indicate the layers in the display area, and does not reflect the specific positions of the layers in the plan view.

As shown in FIG. 3, the single sub-pixel includes a driving transistor DT, the first metal layer 20 includes a shielding layer 21, and the active material layer 40 includes an active layer 41 of the driving transistor DT. The shielding layer may be used to shield the active layer 41 of the driving transistor DT so as to prevent external light from being incident on the active layer 41 of the driving transistor DT to adversely affect the display of the sub-pixels. For example, an orthographic projection of the active layer 41 of the driving transistor DT on the base substrate falls within that of the shielding layer 21 on the base substrate. For example, the single sub-pixel further includes a plurality of switching transistors. Projections of the active layers of the driving transistor and the switching transistor on the base substrate both fall within or overlap the projection of the shielding layer 21 on the base substrate. The second metal layer 60 includes a gate electrode 61 of the driving transistor DT. The third metal layer 80 includes a first electrode 81 such as a drain electrode of the driving transistor DT and a second electrode 82 such as a source electrode. The first electrode layer 120 is, for example, an anode layer, which is also referred to herein as an anode layer 120, including an anode of the light emitting element D in the sub-pixel. The second electrode layer 150 is, for example, a cathode layer, which is also referred to herein as a cathode layer 150, including a cathode of the light emitting element D in the sub-pixel. As an example, the packaging layer 160 may include a first inorganic layer 161, an organic layer 162 and a second inorganic layer 163 sequentially stacked in a direction perpendicular to the base substrate 10.

In some embodiments, the color filter layer CF and the black matrix BM may be pre-formed on the cover plate 170, and then the cover plate 170 with the color filter layer CF and the black matrix BM is aligned with and attached to the display substrate with the packaging layer 160 being formed on the base substrate 10, so as to form the transparent display panel 100. In some alternative embodiments, the color filter layer CF may be arranged on the display substrate including the base substrate 10, for example, it may be directly arranged on the packaging layer 160 or located between the planarization layer 110 and the third metal layer 80. In some embodiments, the black matrix layer BM may also be replaced by stacked color filter layers CF of different colors.

In some embodiments, the luminescent material layer 140 is formed by evaporation on the entire surface. As shown in FIG. 3, for example, the light-emitting element D emits white light, and the color filter layer CF transmits different colors in corresponding different sub-pixel areas, thereby achieving a color display.

In some embodiments, the luminescent material layer 140 may be formed in an opening area of the pixel defining layer 130 by printing. The sub-pixels of different colors may be printed with the luminescent material layer 140 emitting different colors of light. In this case, the color filter layer CF may be omitted, even the cover plate 170 and the black matrix layer may be omitted.

In some embodiments, at least one of the first metal layer 20, the second metal layer 60, the third metal layer 80, the anode layer 120, the planarization layer 110, the pixel defining layer 130, the black matrix layer BM and the color filter layer CF that do not transmit light or have poor light transmission effect is not arranged in the light-transmitting area TA. For example, none of the above-mentioned layers are arranged in the light-transmitting area TA so as to ensure the transparent effect of the light-transmitting area TA.

In the following embodiments, the single pixel structure and the pixel drive circuit of the single pixel in the transparent display panel will be described in detail.

Figure 4:
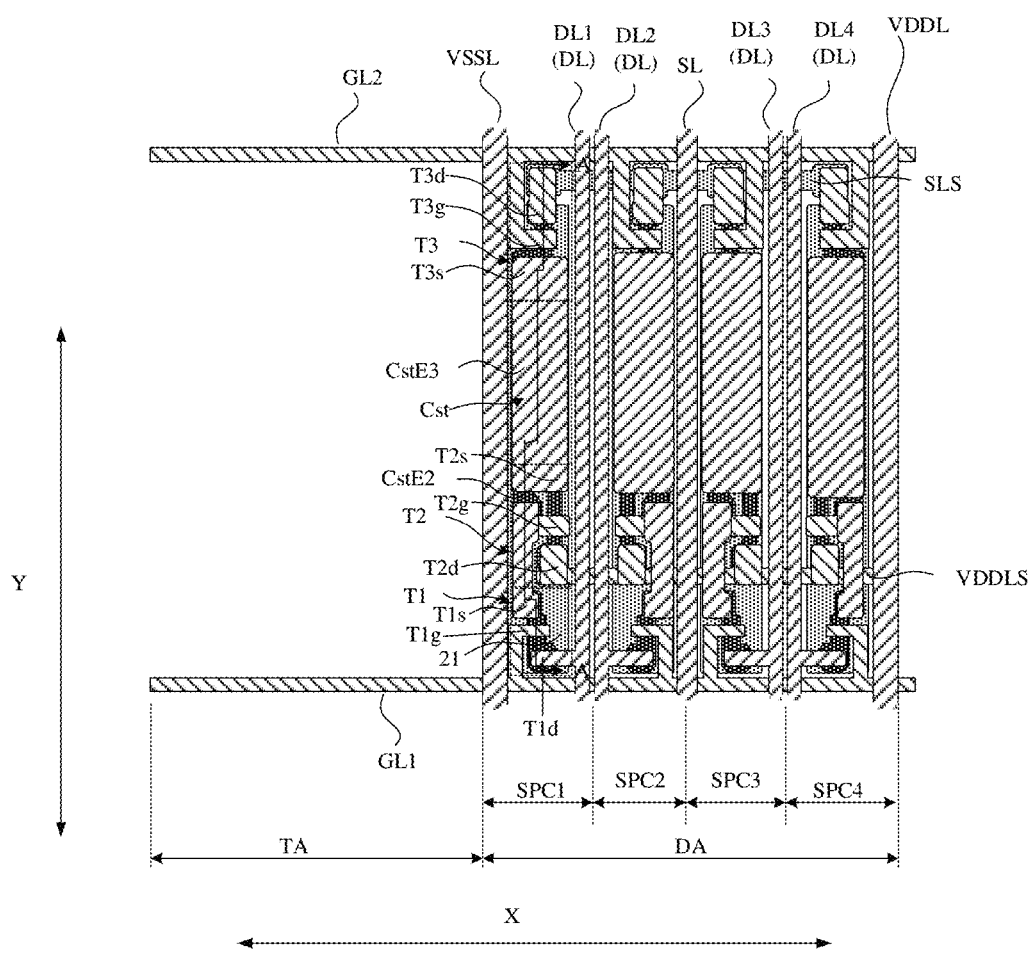
FIG. 4 shows a schematic plan view of a single pixel of the transparent display panel according to some embodiments of the present disclosure.

FIG. 4 is a schematic enlarged view of area B in FIG. 2, showing a schematic plan view of the display area of the single pixel according to some embodiments of the present disclosure. As shown in FIG. 4, the display area DA of the pixel P includes four sub-pixels, namely a first sub-pixel, a second sub-pixel, a third sub-pixel and a fourth sub-pixel. These four sub-pixels may be a red sub-pixel, a green sub-pixel, a blue sub-pixel and a white sub-pixel, respectively. Those skilled in the art may understand that each sub-pixel includes a sub-pixel drive circuit and a light-emitting element D located on the sub-pixel drive circuit, and the light-emitting device of each of the four sub-pixels may be adjusted in shape and arrangement according to actual needs, as long as it is ensured that the sub-pixel drive circuit of each sub-pixel may drive the corresponding light-emitting element D. In the prior art, the pixel defining layer is used to define a position and shape of the light emitting area of the light emitting element. The luminescent material layer of the light emitting element is arranged in the opening of the pixel defining layer. A position and shape of the luminescent material layer of the light emitting element may be adjusted by adjusting a position and shape of the opening of the pixel defining layer according to actual needs.

In order to clearly reflect the structure and positional relationship of each sub-pixel, the light-emitting element of each sub-pixel and the pixel defining layer surrounding each light-emitting element are not shown in FIG. 4. FIG. 4 mainly shows the sub-pixel drive circuits of the first sub-pixel, the second sub-pixel, the third sub-pixel and the fourth sub-pixel, that is, a first sub-pixel drive circuit SPC1, a second sub-pixel drive circuit SPC2, a third sub-pixel drive circuit SPC3 and a fourth sub-pixel drive circuit SPC4. As shown in FIG. 4, the first sub-pixel drive circuit SPC1, the second sub-pixel drive circuit SPC2, the third sub-pixel drive circuit SPC3 and the fourth sub-pixel drive circuit SPC4 all extend in the second direction Y and are arranged side by side along the first direction X in the pixel P. The first sub-pixel drive circuit SPC1, the second sub-pixel drive circuit SPC2, the third sub-pixel drive circuit SPC3 and the fourth sub-pixel drive circuit SPC4 constitute the pixel drive circuit of the pixel P. Therefore, FIG. 4 may also be taken as a schematic structural diagram of the pixel drive circuit of the single pixel according to some embodiments of the present disclosure. In this embodiment, the first sub-pixel drive circuit SPC1, the second sub-pixel drive circuit SPC2, the third sub-pixel drive circuit SPC3 and the fourth sub-pixel drive circuit SPC4 are arranged sequentially away from the light-transmitting area TA of the pixel P.

In this embodiment, a pixel structure with four sub-pixels is illustrated by way of example. Those skilled in the art may understand that in other embodiments, the single pixel may have other number of sub-pixels, such as three sub-pixels, that is, a red sub-pixel, a green sub-pixel and a blue sub-pixel.

Figure 5:
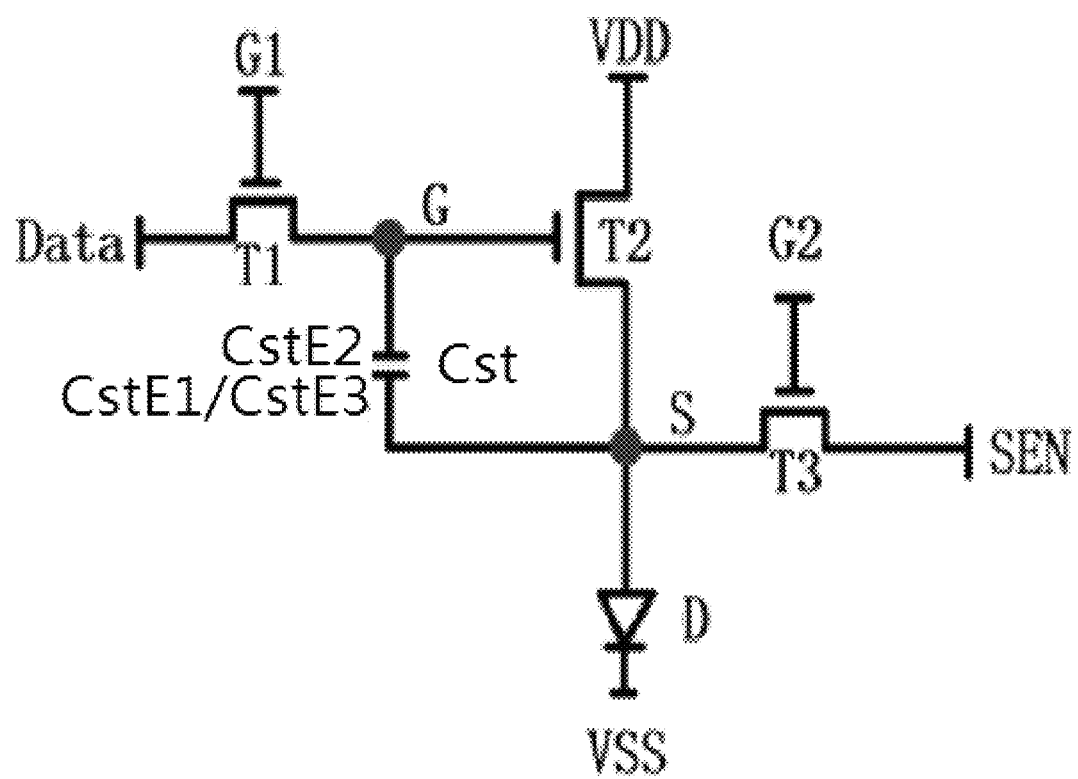
FIG. 5 shows a circuit diagram of the single sub-pixel according to some embodiments of the present disclosure.

FIG. 5 is a circuit diagram of a single sub-pixel according to an embodiment of the present disclosure. The single pixel P in the embodiment of the present disclosure will be explained below with reference to FIG. 4 and FIG. 5.

As shown in FIG. 4, each pixel P corresponds to a first gate line GL1, a second gate line GL2, a first power line VDDL, a second power line VSSL, a detection line SL and four data lines DL. As shown in FIG. 5, each of the first sub-pixel drive circuit SPC1, the second sub-pixel drive circuit SPC2, the third sub-pixel drive circuit SPC3 and the fourth sub-pixel drive circuit SPC4 includes a first transistor T1 (also referred to as a switching transistor T1), a second transistor T2 (also referred to as a driving transistor T2), a third transistor T3 (also referred to as a detection transistor T3) and a storage capacitor Cst. The first gate line GL1 provides a first control signal G1 to each sub-pixel drive circuit. The second gate line GL2 provides a second control signal G2 to each sub-pixel. The first data line DL1, the second data line DL2, the third data line DL3 and the fourth data lines DL4 provide data signals Data respectively to the first sub-pixel drive circuit SPC1, the second sub-pixel drive circuit SPC2, the third sub-pixel drive circuit SPC3 and the fourth sub-pixel drive circuit SPC4. The first power line VDDL provides a constant first voltage signal, such as a VDD voltage signal, to each sub-pixel drive circuit. The second power line VSSL provides a constant second voltage signal, such as a VSS voltage signal, to each sub-pixel drive circuit. The detection line SL is configured to provide a reset signal to each sub-pixel drive circuit, and is used to sample and detect electrical characteristics of each sub-pixel drive circuit, such as a threshold voltage of the second transistor T2, so as to achieve an external compensation and obtain a better display effect.

Specifically, each sub-pixel drive circuit includes a switching transistor T1, a driving transistor T2, a detection transistor T3 and a storage capacitor Cst. The driving transistor T2 is exactly the driving transistor DT in FIG. 3. The switching transistor T1 has a gate electrode for receiving the first control signal G1 provided by the first gate line GL1, a first electrode such as a drain electrode for receiving the data signal Data provided by the data line DL, and a second electrode such as a source electrode electrically connected at a first node G to a second capacitor electrode CstE2 of the storage capacitor Cst and a gate electrode of the driving transistor T2. The switching transistor T1 is configured to write the data signal Data to the gate electrode of the driving transistor T2 and the storage capacitor Cst in response to the first control signal G1.

The driving transistor T2 has a first electrode such as a drain electrode electrically connected to the first power line VDDL through a first power connection line VDDLS and configured to receive the first voltage signal such as the VDD voltage signal provided by the first power line VDDL, and a second electrode such as a source electrode electrically connected to the second capacitor electrode CstE2 of the storage capacitor Cst and configured to be electrically connected to the anode of the light emitting element D. The driving transistor T2 is configured to control a current of driving the light-emitting element D under a voltage of the gate electrode of the driving transistor T2.

The detection transistor T3 has a gate electrode for receiving the second control signal G2 provided by the second gate line GL2, a first electrode such as a source electrode electrically connected at a second node S to the second electrode of the driving transistor T2 and a first capacitor electrode CstE1 of the storage capacitor Cst, and a second electrode such as a drain electrode electrically connected to the detection line SL through the detection connection line SLS and configured to obtain the reset signal from the detection line SL and provide a sampling detection signal SEN to the detection line SL. The detection transistor T3 is configured to detect electrical characteristics of the sub-pixel drive circuit to which it belongs in response to the second control signal G2 so as to achieve an external compensation. The electrical characteristics include, for example, a threshold voltage and/or carrier mobility of the switching transistor T1, or a threshold voltage and driving current of the light-emitting element.

The light-emitting element D has an anode electrically connected to the second electrode, for example, the source electrode, of the driving transistor T2, and a cathode electrically connected to the second power line VSSL, for example, through a through hole, to receive the VSS voltage signal. The light-emitting element D achieves light emission based on the current flowing therethrough, and a luminous intensity is determined by an intensity of the current flowing through the light-emitting element D.

In some embodiments, the storage capacitor Cst may include a third capacitor electrode CstE3 electrically connected to the first capacitor electrode CstE1. The first capacitor electrode CstE1, the second capacitor electrode CstE2 and the third capacitor electrode CstE3 are sequentially stacked on the base substrate 10. The first capacitor electrode CstE1 and the second capacitor electrode CstE2 have an overlapping area, and they form a first capacitor. The third capacitor electrode CstE3 and the second capacitor electrode CstE2 have an overlapping area, and they form a second capacitor. The storage capacitor Cst may be regarded as a parallel connection of the first capacitor and the second capacitor, which increases the capacitance of the storage capacitor Cst.

The transistors used in the embodiments of the present disclosure may all be thin film transistors or field effect transistors or other switching devices with the same characteristics. In the embodiments of the present disclosure, thin film transistors are used as examples for description. The source electrode and drain electrode of the transistor used here may be symmetrical in structure, and thus may have no difference in structure. In the embodiments of the present disclosure, in order to distinguish the two electrodes of the transistor other than the gate electrode, one electrode is directly described as the first electrode and the other electrode is directly described as the second electrode. In addition, transistors may be divided into N-type and P-type transistors according to their characteristics. When the transistor is a P-type transistor, a turn-on voltage is a low-level voltage (for example, 0V, −5V, −10V or other suitable voltages), and a turn-off voltage is a high-level voltage (for example, 5V, 10V or other suitable voltages). When the transistor is an N-type transistor, the turn-on voltage is a high-level voltage (for example, 5V, 10V or other suitable voltages), and the turn-off voltage is a low-level voltage (for example, 0V, −5V, −10V or other suitable voltages). It should be noted that in the descriptions of the present disclosure, N-type transistors are illustrated by way of example, but it is not a limitation to the present disclosure.

As shown in FIG. 4, in a region corresponding to the single pixel P, that is, between the two ends of the single pixel in the first direction X, the first gate line GL1 and the second gate line GL2 both extend in the first direction X, for example, in a linear shape. The first gate line GL1 and the second gate line GL2 are respectively arranged on both sides of the light-transmitting area TA, that is, the light-transmitting area TA is sandwiched between the first gate line GL1 and the second gate line GL2. In other embodiments, the first gate line GL1 and the second gate line GL2 may also pass through the light-transmitting area TA. In the region corresponding to the single pixel P, that is, in the range shown in FIG. 4, the first power line VDDL, the second power line VSSL, the detection line SL and the four data lines DL all extend in the second direction Y, for example, in a linear shape. Specifically, the detection line SL is located between the second sub-pixel drive circuit SPC2 and the third sub-pixel drive circuit SPC3. The first data line DL1 and the second data line DL2 are arranged between the first sub-pixel drive circuit SPC1 and the second sub-pixel drive circuit SPC2. The first data line DL1 is arranged closer to the first sub-pixel drive circuit SPC1 than the second data line DL2, and the second data line DL2 is arranged closer to the second sub-pixel drive circuit SPC2 than the first data line DL1. That is, the first data line DL1 is located between the first sub-pixel drive circuit SPC1 and the second data line DL2, and the second data line DL2 is located between the first data line DL1 and the second sub-pixel drive circuit SPC2. The third data line DL3 and the fourth data line DL4 are arranged between the third sub-pixel drive circuit SPC3 and the fourth sub-pixel drive circuit SPC4. The third data line DL3 is arranged closer to the third sub-pixel drive circuit SPC3 than the fourth data line DL4, and the fourth data line DL4 is arranged closer to the fourth sub-pixel drive circuit SPC4 than the third data line DL3. That is, the third data line DL3 is located between the third sub-pixel drive circuit SPC3 and the fourth data line DL4, and the fourth data line DL4 is located between the third data line DL3 and the fourth sub-pixel drive circuit SPC4. The second power line VSSL is located on a side of the first sub-pixel drive circuit SPC1 away from the first data line DL1, that is, it is located between the light-transmitting area TA and the first sub-pixel drive circuit SPC1. The first power line VDDL is located on a side of the fourth sub-pixel drive circuit SPC4 away from the fourth data line DL4. In this embodiment, a structure of the first sub-pixel drive circuit SPC1 and that of the fourth sub-pixel drive circuit SPC4 are approximately mirror-symmetrical with respect to the position of the detection line SL, and a structure of the second sub-pixel drive circuit SPC2 and that of the third sub-pixel drive circuit SPC3 are approximately mirror-symmetrical with respect to the position of the detection line SL.

It should be noted that "mirror-symmetrical" in the present disclosure means that a positional relationship, such as a left-right positional relationship of the structures is approximately symmetrical. For example, for the structures of two sub-pixels that are approximately mirror-symmetrical, in one sub-pixel, structure A is on the left of structure B, and in the other sub-pixel, structure A is on the right of structure B. For example, "mirror-symmetrical" may also mean that shapes, sizes or orientations of the structures are approximately symmetrical with respect to a certain straight line (for example, a row direction line or a column direction line). For example, for the structures of two sub-pixels that are approximately mirror-symmetrical, in one sub-pixel, structure A' protrudes to the left, and in the other sub-pixel, corresponding structure A' protrudes to the right. The corresponding structure A' may be the structure located in the same layer as the structure A and functioning the same as the structure A.

FIG. 4 and FIG. 6 to FIG. 20 are schematic diagrams of the manufacturing process of the display panel of some embodiments of the present disclosure, showing the structure of the pixel P of the transparent display panel. In this embodiment, a top emission OLED display panel is illustrated by way of example in describing the transparent display panel. The single pixel P includes a display area DA and a light-transmitting area TA. The first sub-pixel drive circuit SPC1, the second sub-pixel drive circuit SPC2, the third sub-pixel drive circuit SPC3 and the fourth sub-pixel drive circuit SPC4 are arranged in the display area DA, sequentially away from the light-transmitting area TA. The pixel drive circuit of each sub-pixel includes a first transistor T1, a second transistor T2, a third transistor T3 and a storage capacitor Cst.

Figure 6:
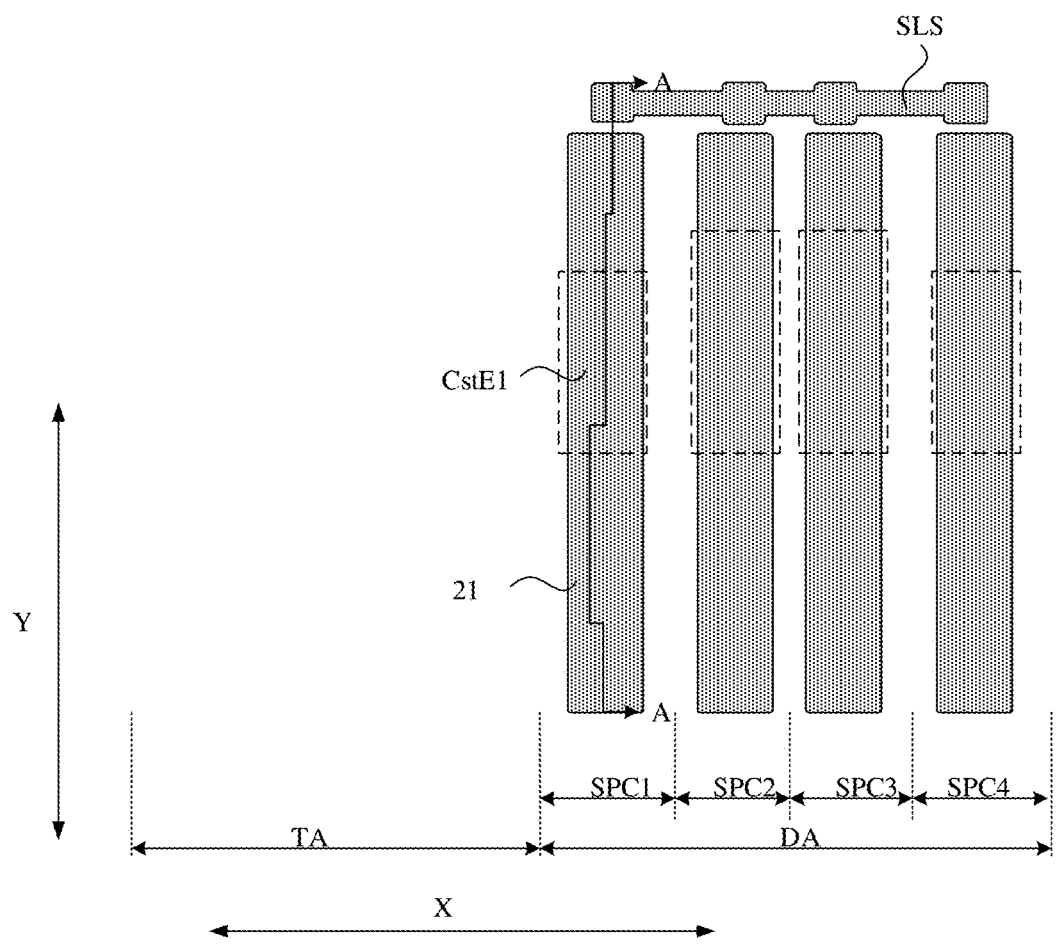
FIG. 6 shows a schematic plan view of the single pixel of the transparent display panel according to some embodiments of the present disclosure after a pattern of a first metal layer is formed in the manufacturing process.
Figure 7:
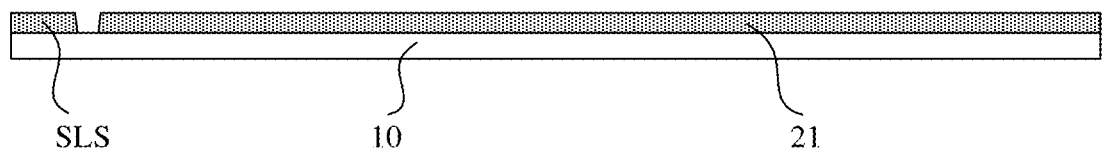
FIG. 7 shows a schematic cross-sectional view taken along line A-A in FIG. 6.

FIG. 6 shows a schematic plan view of the single pixel of the transparent display panel according to some embodiments of the present disclosure after a pattern of a first metal layer is formed in the manufacturing process. FIG. 7 shows a schematic cross-sectional view taken along line A-A in FIG. 6 (it should be noted that a cutting position indicated by line A-A in FIG. 6 is consistent with that indicated by line A-A in other subsequent figures). As shown in FIGS. 6 and 7, a pattern of the first metal layer 20 is first formed on the base substrate. Specifically, a first metal film is deposited on the base substrate 10 and patterned by a patterning process so as to form the pattern of the first metal layer 20 on the base substrate 10. The pattern of the first metal layer 20 includes a shielding layer 21 and a detection connection line SLS. Each sub-pixel drive circuit includes the shielding layer 21, and the detection connection line SLS is a strip structure extending in the first direction X across the four sub-pixel drive circuits. The detection connection line SLS is configured to be connected to the detection line SL formed subsequently, so that the detection line SL provides the reset signal to each sub-pixel drive circuit and samples and detects the electrical characteristics of each sub-pixel drive circuit, such as the threshold voltage of the second transistor T2, to achieve the external compensation. In some embodiments, the shielding layer 21 has a long rectangular shape and extends in the second direction Y. The shielding layer 21 is configured to perform light-shielding treatment on channels of transistors formed subsequently, which reduces the intensity of light irradiated on the transistors and reduces leakage current, thereby reducing the influence of light on the characteristics of the transistors. At least a middle portion of the shielding layer 21 (encircled by the dashed box) serves as a capacitor electrode of the first capacitor, namely the first capacitor electrode CstE1, which is configured to form the first capacitor with the second capacitor electrode CstE2 formed subsequently. In the second direction Y, the shielding layer 21 has a length greater than a distance between the gate electrode of the switching transistor T1 and the gate electrode of the detection transistor T3 formed subsequently. In some embodiments, the length of the shielding layer 21 is greater than a distance between the drain electrode of the switching transistor T1 and the drain electrode of the third transistor T3 formed subsequently. By combining FIG. 4 and FIG. 6, the pattern of the first metal layer 20 in the first sub-pixel drive circuit SPC1 and that in the fourth sub-pixel drive circuit SPC4 are mirror-symmetrical with respect to the detection line SL formed subsequently. The pattern of the first metal layer 20 in the second sub-pixel drive circuit SPC2 and that in the third sub-pixel drive circuit SPC3 are approximately mirror-symmetrical with respect to the detection line SL formed subsequently. After this patterning process, the shielding layer 21 and the detection connection line SLS are formed in the display area DA, and the first metal layer is not provided in the light-transmitting area TA.

Figure 8:
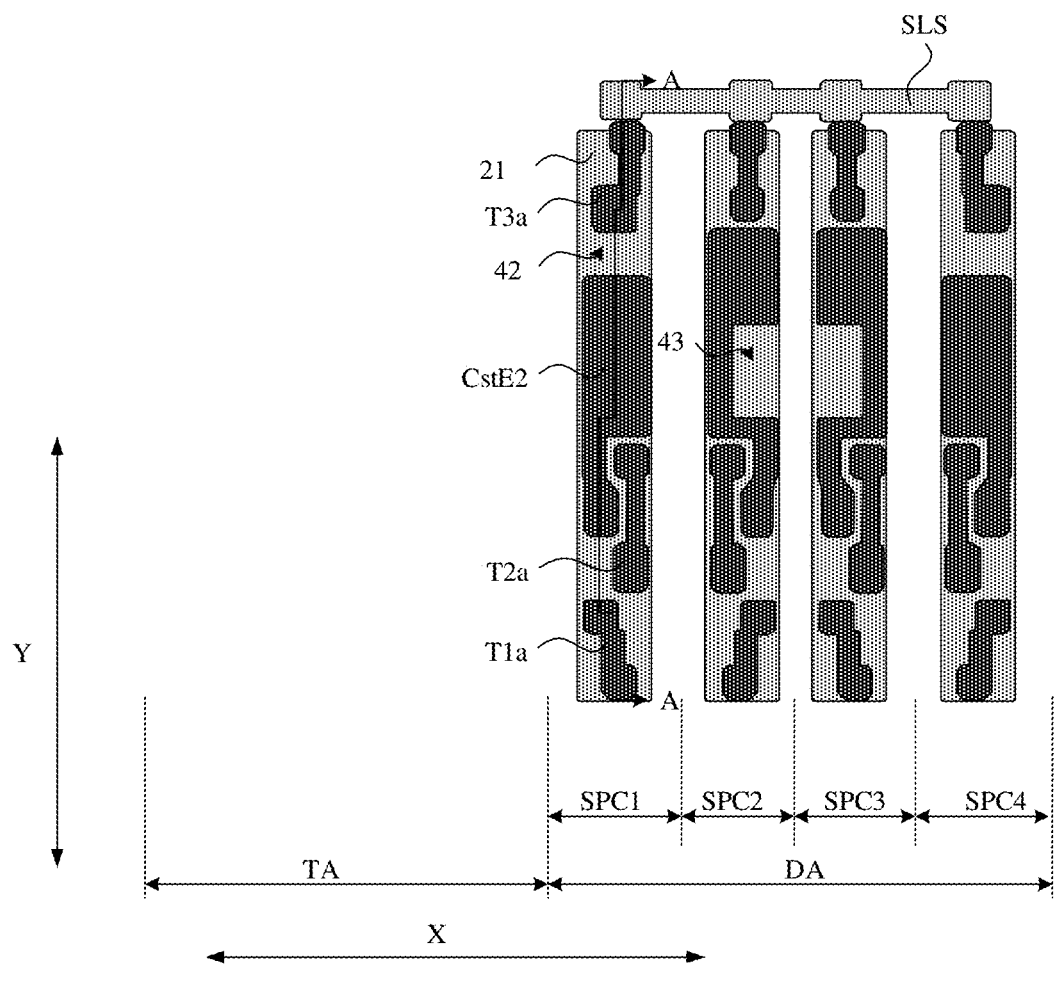
FIG. 8 shows a schematic plan view of the single pixel of the transparent display panel according to some embodiments of the present disclosure after a pattern of an active material layer is formed in the manufacturing process.
Figure 9:
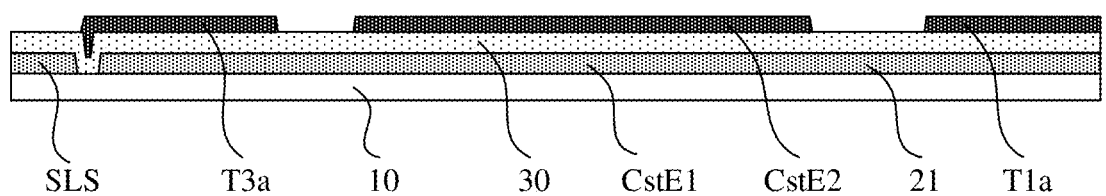
FIG. 9 shows a schematic cross-sectional view taken along line A-A in FIG. 8.

FIG. 8 shows a schematic plan view of the single pixel of the transparent display panel according to some embodiments of the present disclosure after a pattern of an active material layer is formed in the manufacturing process. FIG. 9 shows a schematic cross-sectional view taken along line A-A in FIG. 8. As shown in FIGS. 8 and 9, the pattern of the active material layer 40 is formed. Specifically, a first insulating film and an active material film such as a metal oxide film are sequentially deposited on the base substrate 10 formed with the aforementioned pattern, and the active material film is patterned by a patterning process, so as to form a first insulating layer 30 covering the pattern of the first metal layer 20 and form the pattern of the active material layer 40 formed on the first insulating layer 30. The active material layer 40 includes the active layer of the switching transistor T1 (also referred to as a first active layer T1a), the active layer of the driving transistor T2 (also referred to as a second active layer T2a), the active layer of the detection transistor T3 (also referred to as a third active layer T3a) and the second capacitor electrode CstE2 which are provided in each sub-pixel drive circuit. An orthographic project of the second capacitor electrode CstE2 on the base substrate 10 has an overlapping area with an orthographic project of the first capacitor electrode CstE1 on the base substrate 10. The first capacitor electrode CstE1 and the second capacitor electrode CstE2 form the first capacitor.

In some embodiments, an orthographic projection of the first active layer T1a, the second active layer T2a and the third active layer T3a on the base substrate 10 has an overlapping area with an orthographic projection of the shielding layer 21 on the base substrate 10, so that the shielding layer 21 may shield channel regions of the switching transistor T1, the driving transistor T2 and the detecting transistor T3 to prevent light from affecting the channels, so as to prevent the channels from generating photo-generated leakage current and affecting the display effect. Any two of the first active layer T1a, the second active layer T2a, the third active layer T3a and the second capacitor electrode CstE2 are spaced apart from each other. That is, there is no overlapping area between any two of an orthographic projection of the first active layer T1a on the base substrate 10, an orthographic projection of the second active layer T2a on the base substrate 10, an orthographic projection of the third active layer T3a on the base substrate 10, and an orthographic projection of the second capacitor electrode CstE2 on the base substrate 10. This is beneficial to design the channel width-to-length ratio of the switching transistor T1, the driving transistor T2 and the detecting transistor T3 according to relevant requirements. In some embodiments, as shown in FIGS. 8 and 9, a spacing region 42 is provided between the second capacitor electrode CstE2 and the third active layer T3a in the first sub-pixel drive circuit SPC1 and the fourth sub-pixel drive circuit SPC4, and there is also a spacing between the second capacitor electrode CstE2 and the third active layer T3a in the second sub-pixel drive circuit SPC2 and the third sub-pixel drive circuit SPC3, as shown in FIG. 8. Moreover, the spacing region 42 in the first sub-pixel drive circuit SPC1 and the fourth sub-pixel drive circuit SPC4 is larger than the spacing in the second sub-pixel drive circuit SPC2 and the third sub-pixel drive circuit SPC3, so as to facilitate subsequent formation of a via hole in the spacing region 42 in the first sub-pixel drive circuit SPC1 and the fourth sub-pixel drive circuit SPC4. A notch region 43 is provided in a middle of the second capacitor electrode CstE2 of the second sub-pixel drive circuit SPC2 and the third sub-pixel drive circuit SPC3. There is no active material layer 40 in the spacing region 42 and the notch region 43. In this embodiment, as shown in FIG. 4 and FIG. 8, the pattern of the active material layer 40 in the first sub-pixel drive circuit SPC1 and that in the fourth sub-pixel drive circuit SPC4 are approximately mirror-symmetrical with respect to the position of the detection line SL formed subsequently, and the pattern of the active material layer 40 in the second sub-pixel drive circuit SPC2 and that in the third sub-pixel drive circuit SPC3 are approximately mirror-symmetrical with respect to the position of the detection line SL formed subsequently. After this patterning process, the pattern of the active material layer 40 is formed in the display area DA but not in the light-transmitting area TA. The light-transmitting area TA includes the base substrate 10 and the first insulating layer 30 provided on the base substrate 10.

Figure 10:
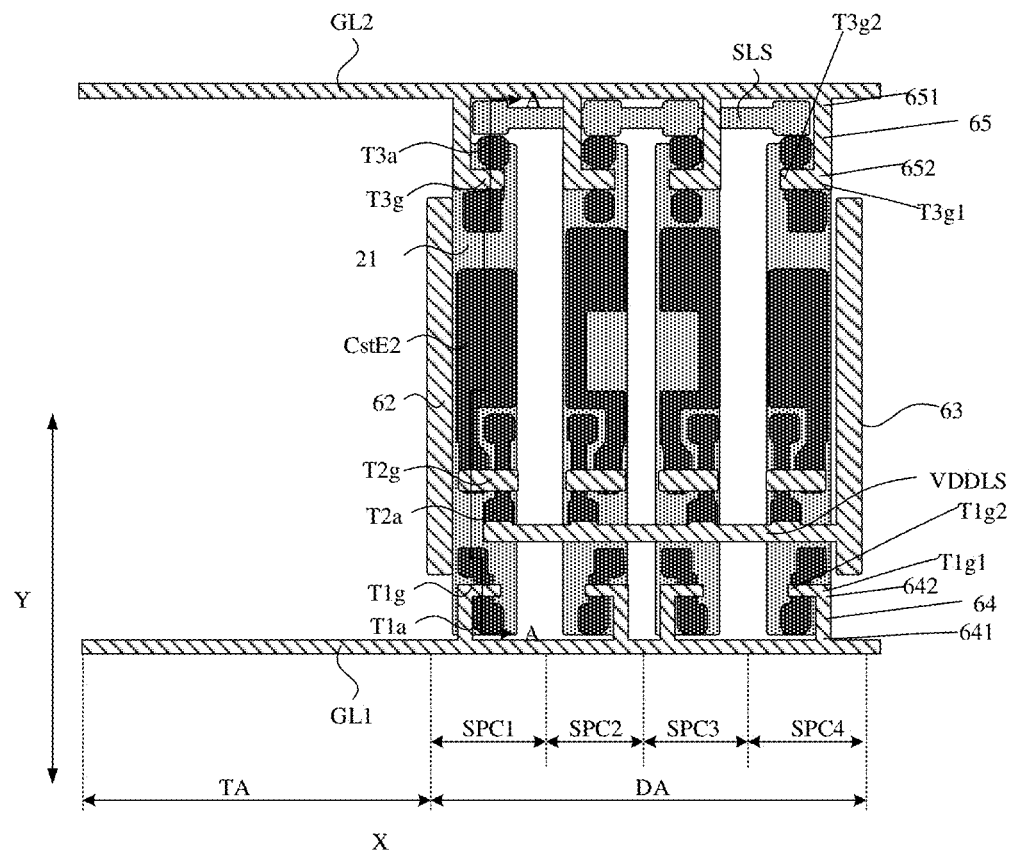
FIG. 10 shows a schematic plan view of the single pixel of the transparent display panel according to some embodiments of the present disclosure after a pattern of a second metal layer is formed in the manufacturing process.
Figure 11:
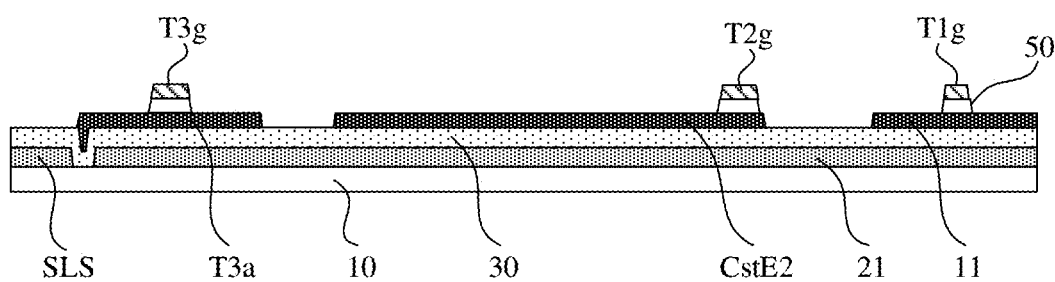
FIG. 11 shows a schematic cross-sectional view taken along line A-A in FIG. 10.

FIG. 10 shows a schematic plan view of the single pixel of the transparent display panel according to some embodiments of the present disclosure after a pattern of a second metal layer is formed in the manufacturing process. FIG. 11 shows a schematic cross-sectional view taken along line A-A in FIG. 10. As shown in FIGS. 10 and 11, the pattern of the second metal layer 60 is then formed, including: depositing a second insulating film and a second metal film sequentially on the base substrate 10 formed with the aforementioned pattern, and patterning the second insulating film and the second metal film by a patterning process so as to form the pattern of the second insulating layer 50 and the pattern of the second metal layer 60 arranged on the second insulating layer 50. In some embodiments, the pattern of the second insulating layer 50 and the pattern of the second metal layer 60 are formed using the same mask, and the patterns are the same. The pattern of the second metal layer 60 includes a first gate line GL1, a second gate line GL2, a first power connection line VDDLS, a first auxiliary line 62 and a second auxiliary line 63 formed in each pixel P, and the gate electrode of the switching transistor T1 (also referred to as a first gate electrode T1g), the gate electrode of the driving transistor T2 (also referred to as a second gate electrode T2g) and the gate electrode of the detection transistor T3 (also referred to as a third gate electrode T3g) formed in each sub-pixel drive circuit. The pattern of the second metal layer 60 further includes a first gate connection line 64 and a second gate connection line 65 formed in each sub-pixel drive circuit. As shown in FIG. 10, in the region corresponding to the single pixel P, that is, in the region shown in FIG. 10, the first gate line GL1 and the second gate line GL2 are arranged in parallel, and both extend straight in the first direction X. The first gate line GL1 is located on a lower side of the light-transmitting area TA, and the second gate line GL2 is located on an upper side of the light-transmitting area TA. That is, the light-transmitting area TA is sandwiched between the first gate line GL1 and the second gate line GL2. Each sub-pixel drive circuit is also sandwiched between the first gate line GL1 and the second gate line GL2.

The first gate electrode T1g extends in the first direction X across the first active layer T1a, and is electrically connected to the first gate line GL1 through the first gate connection line 64 extending in the second direction Y.

Specifically, the first gate electrode T1g includes a connection end T1g1 and a free end T1g2, and the first gate connection line 64 includes a first end 641 and a second end 642. The first end 641 of the first gate connection line 64 is electrically connected to the first gate line GL1, and the second end 642 of the first gate connection line 64 is electrically connected to the connection end T1g1 of the first gate electrode T1g. In some embodiments, the first gate electrode T1g, the first gate connection line 64 and the first gate line GL1 are formed as an integral structure. The second gate electrode T2g extends in the first direction X across the second active layer T2a, and has an overlapping area with the second capacitor electrode CstE2. The third gate electrode T1g extends in the first direction X across the third active layer T1a, and is electrically connected to the second gate line GL2 through the second gate connection line 65 extending in the second direction Y. Specifically, the third gate electrode T3g includes a connection end T3g1 and a free end T3g2, and the second gate connection line 65 includes a first end 651 and a second end 652. The first end 651 of the second gate connection line 65 is electrically connected to the second gate line GL1, and the second end 652 of the second gate connection line 65 is electrically connected to the connection end T3g1 of the third gate electrode T3g. In some embodiments, the third gate electrode T3g, the second gate connection line 65 and the second gate line GL2 are formed as an integral structure.

The first auxiliary line 62 is formed in the region where the second power line VSSL is located, extends in the second direction Y, and is configured to be electrically connected to the second power line VSSL formed subsequently. Thus, the second power line VSSL formed subsequently is arranged in parallel with the first auxiliary line 62 through the via hole, thereby effectively reducing the impedance of the second power line VSSL. In some embodiments, in the second direction Y, the first auxiliary line 62 is located between the first gate electrode T1g and the third gate electrode T3g. Those skilled in the art may understand that the first auxiliary line 62 is not necessary, and in some embodiments, the first auxiliary line 62 may be omitted.

The second auxiliary line 63 is formed in the region where the first power line VDDL is located, extends in the second direction Y, and is configured to be electrically connected to the first power line VDDL formed subsequently. Thus, the first power line VDDL formed subsequently is arranged in parallel with the second auxiliary line 63 through the via hole, thereby effectively reducing the impedance of the first power line VDDL. In some embodiments, in the second direction Y, the second auxiliary line 63 is located between the first gate electrode T1g and the third gate electrode T3g. Those skilled in the art may understand that the second auxiliary line 63 is not necessary, and in some embodiments, the second auxiliary line 63 may be omitted.

The first power connection line VDDLS extends in the first direction X, spans the four sub-pixel drive circuits, and is configured to be electrically connected to the first power line VDDL formed subsequently. In some embodiments, the first power connection line VDDLS may be electrically connected to the second auxiliary line 63, and the two may be, for example, formed as an integral structure.

As shown in FIG. 11, the pattern of the second insulating layer 50 is the same as that of the second metal layer 60, that is, the second insulating layer 50 is located under the second metal layer 60 and is not provided in the area outside the second metal layer 60. As shown in FIG. 10, in addition to the first power supply connection line VDDLS, the pattern of the second metal layer in the first sub-pixel drive circuit SPC1 and that in the fourth sub-pixel drive circuit SPC4 are approximately mirror-symmetrical with respect to the position of the detection line SL formed subsequently, and the pattern of the second metal layer in the second sub-pixel drive circuit SPC2 and that in the third sub-pixel drive circuit SPC3 are approximately mirror-symmetrical with respect to the position of the detection line SL formed subsequently.

In some embodiments, this process further includes conductization treatment. Conductization treatment is to, after the pattern of the second metal layer 60 is formed, perform plasma treatment by using as a shield the pattern of the second metal layer 60 including the first gate electrode T1g, the second gate electrode T2g and the third gate electrode T3g. The portions of the active material layer in the area shielded by the first gate electrode T1g, the second gate electrode T2g and the third gate electrode T3g (that is, the portions of the active material layer 40 overlapping the first gate electrode T1g, the second gate electrode T2g and the third gate electrode T3g) respectively serve as the channel regions of the transistors. The portions of the active material layer 40 in the area not shielded by the second metal layer 60 is conductized, forming a conductive second capacitor electrode CstE2 and a conductive source/drain area. After this patterning process, the pattern of the second metal layer 60 is formed in the display area DA but not in the light-transmitting area TA. The light-transmitting area TA includes the base substrate 10 and the first insulating layer 30 provided on the base substrate 10.

Figure 12:
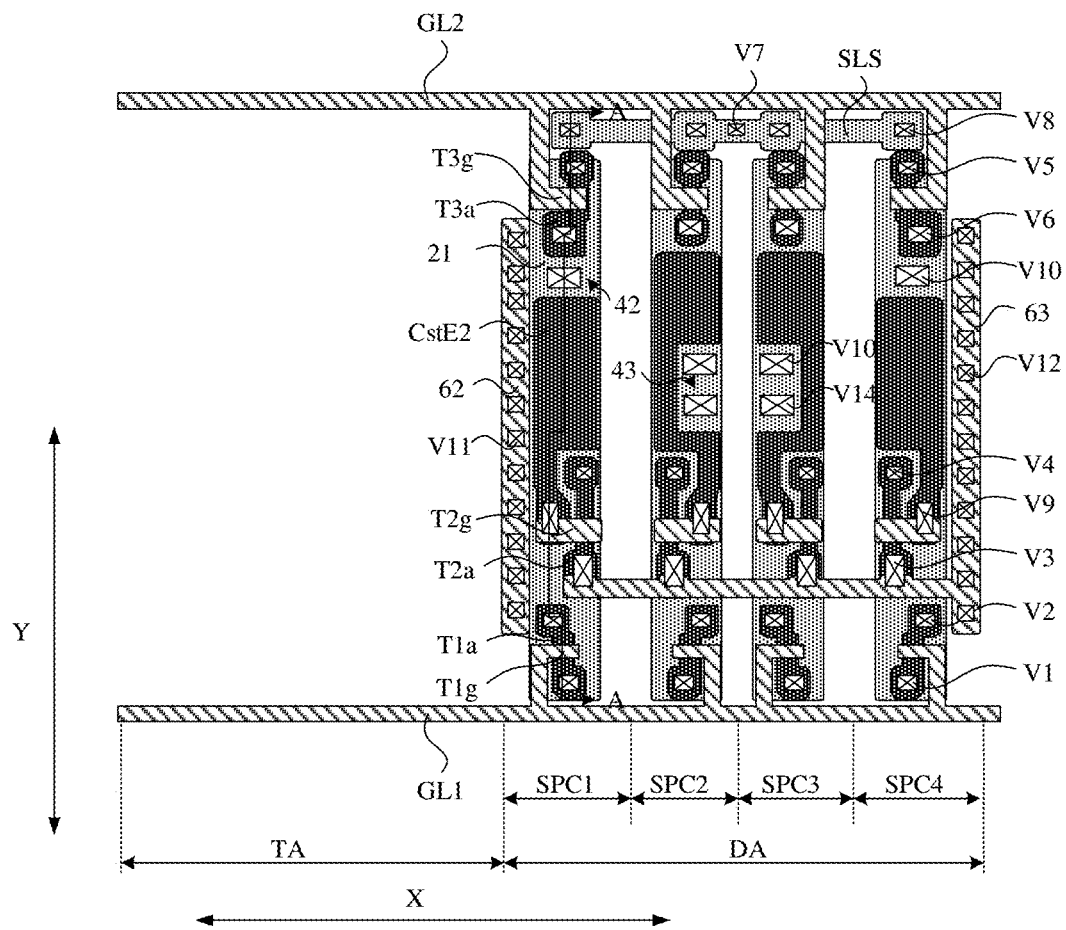
FIG. 12 shows a schematic plan view of the single pixel of the transparent display panel according to some embodiments of the present disclosure after a pattern of a third insulating layer is formed in the manufacturing process.
Figure 13:
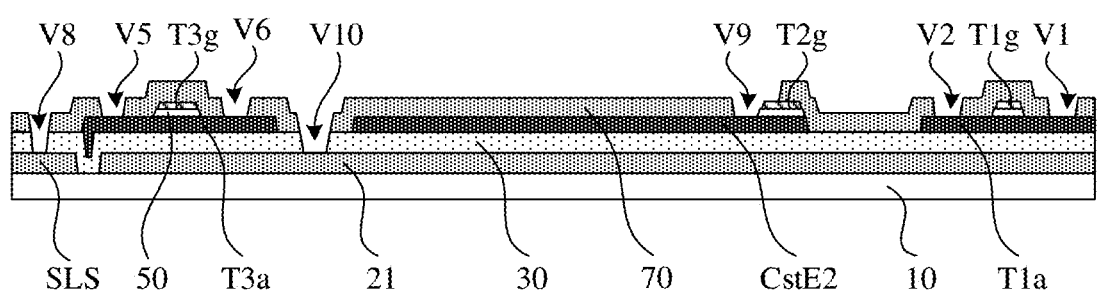
FIG. 13 shows a schematic cross-sectional view taken along line A-A in FIG. 12.

FIG. 12 shows a schematic plan view of the single pixel of the transparent display panel according to some embodiments of the present disclosure after a pattern of a third insulating layer is formed in the manufacturing process. FIG. 13 shows a schematic cross-sectional view taken along line A-A in FIG. 12. As shown in FIGS. 12 and 13, the pattern of the third insulating layer 70 is then formed, including: depositing a third insulating film on the base substrate 10 formed with the aforementioned patterns, and patterning the third insulating film by a patterning process so as to form the pattern of the third insulating layer 70 covering the aforementioned structure. The third insulating layer 70 is provided with a plurality of via holes, including: a first via hole V1 and a second via hole V2 located on both sides of the first gate electrode T1g, a third via hole V3 and a fourth via hole V4 located on both sides of the second gate electrode T2g, a fifth via hole V5 and a sixth via hole V6 located on both sides of the third gate electrode T3g, a seventh via hole V7 at a position where the detection connection line SLS overlaps the detection line and an eighth via hole V8 at a position where the detection connection line SLS overlaps the drain electrode of the detection transistor T3, a ninth via hole V9 at a junction of the second gate electrode T2g and the second capacitor electrode CstE2, a tenth via hole V10 located at a position of the shielding layer 21 not covered by the active material layer 40, for example, at a position where the spacing region 42 or the notch region 43 is located, a fourteenth via hole V14, a plurality of eleventh via holes V11 located at a position where the first auxiliary line 62 is located, and a plurality of twelfth via holes V12 located at a position where the second auxiliary line 63 is located.

The third insulating layer 70 in the first via hole V1 and the second via hole V2 is etched away, exposing surfaces at both ends of the first active layer T1a. The third via hole V3 is arranged at the junction of the first power connection line VDDLS and the second active layer T2a, and the third insulating layer 70 in the third via hole V3 is etched away, exposing both the surface of the second active layer T2a and the surface of the first power connection line VDDLS. The third insulating layer 70 in the fourth via hole V4 is etched away, exposing the surface of the second active layer T2a. The third insulating layer 70 in the fifth via hole V5 and the sixth via hole V6 is etched away, exposing surfaces at both ends of the third active layer T3a. The seventh via hole V7 is located at the position where the detection connection line SLS overlaps the detection line SL formed subsequently. The eighth via hole V8 is formed in each sub-pixel drive circuit. The first insulating layer 30 and the third insulating layer 70 in the seventh via hole V7 and the eighth via hole V8 are etched away, exposing the surface of the detection connection line SLS. The ninth via hole V9 is located at the junction of the second gate electrode T2g and the second capacitor electrode CstE2. The third insulating layer 70 in the ninth via hole V9 is etched away, exposing the surface of the second gate electrode T2g and the surface of the second capacitor electrode CstE2. An orthographic projection of the tenth via hole V10 in the first sub-pixel drive circuit SPC1 and the fourth sub-pixel drive circuit SPC4 on the base substrate 10 falls within an orthographic projection of the spacing region 42 between the second capacitor electrode CstE2 and the third active layer T3a on the base substrate 10. An orthographic projection of the tenth via hole V10 in the second sub-pixel drive circuit SPC2 and the third sub-pixel drive circuit SPC3 on the base substrate falls within an orthographic projection of the notch region 43 in the middle of the second capacitor electrode CstE2 on the base substrate 10. The first insulating layer 30 and the third insulating layer 70 in the tenth via hole V10 are etched away, exposing the surface of the shielding layer 21.

The third insulating layer 70 in the fourteenth via hole V14 is etched away, exposing the first insulating layer 30. The fourteenth via hole V14 is designed for process symmetry. It is formed only in the second sub-pixel drive circuit SPC2 and the third sub-pixel drive circuit SPC3, and is not present in the first sub-pixel drive circuit SPC1 and the fourth sub-pixel drive circuit SPC4. An orthographic projection of the fourteenth via hole V14 on the base substrate 10 falls within the orthographic projection of the notch region 43 in the middle of the second capacitor electrode CstE2 on the base substrate 10. In the subsequent process, the thirteenth via hole V13 for connecting the anodes is formed in each sub-pixel drive circuit. In the first sub-pixel drive circuit SPC1 and the fourth sub-pixel drive circuit SPC4, the thirteenth via hole V13 subsequently formed covers the sixth via hole V6 that only penetrates the third insulating layer 70, thus forming a sleeve hole. In the second sub-pixel drive circuit SPC2 and the third sub-pixel drive circuit SPC3, the thirteenth via hole V13 formed subsequently is located at the notch region 43 and close to the tenth via hole V10. For the sake of process symmetry of the sub-pixel drive circuits, the fourteenth via hole V14 similar to the sixth via hole V6 in the first sub-pixel drive circuit SPC1 and the fourth sub-pixel drive circuit SPC4 is formed at the position of the thirteenth via hole V13 in the second sub-pixel drive circuit SPC2 and the third sub-pixel drive circuit SPC3, so that the thirteenth via hole V13 subsequently formed covers the fourteenth via hole V14 to form a sleeve hole. The fourteenth via hole V14 is not necessary, and in some embodiments, the fourteenth via hole may not be provided.

The eleventh via holes V11 are located on the first auxiliary line 62, that is, the orthographic projection of the plurality of eleventh via holes V11 on the base substrate 10 falls within the orthographic projection of the first auxiliary line 62 on the base substrate 10. The plurality of eleventh via holes V11 are arranged at intervals, and the third insulating layer 70 in the eleventh via holes V11 is etched away, exposing the surface of the first auxiliary line 62.

The plurality of twelfth via holes V12 are located on the second auxiliary line 63, and the orthographic projection of the plurality of twelfth via holes V12 on the base substrate 10 falls within the orthographic projection of the second auxiliary line 63 on the base substrate 10. The plurality of twelfth via holes V12 are arranged at intervals, and the third insulating layer 70 in the twelfth via hole V12 is etched away, exposing the surface of the second auxiliary line 63. After this patterning process, a plurality of via patterns are formed in the display area DA, and the light-transmitting area TA includes the first insulating layer 30 and the third insulating layer 70 stacked on the base substrate 10.

Figure 14:
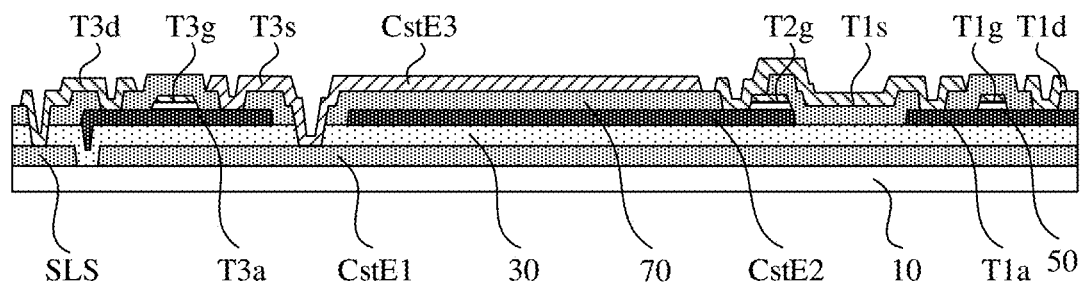
FIG. 14 shows a schematic cross-sectional view taken along line A-A in FIG. 4.

FIG. 4 shows a schematic plan view of the single pixel of the transparent display panel according to some embodiments of the present disclosure after a pattern of a third metal layer is formed in the manufacturing process. FIG. 14 shows a schematic cross-sectional view taken along line A-A in FIG. 4. As shown in FIGS. 4 and 14, the pattern of the third metal layer 80 is then formed. Specifically, a third metal film is deposited on the base substrate formed with the aforementioned pattern and is patterned by a patterning process so as to form the pattern of the third metal layer on the third insulating layer 70. The third metal layer 80 includes a first power line VDDL, a second power line VSSL, a detection line SL and four data lines DL corresponding to each pixel P, the source electrode and drain electrode of the switching transistor T1 (also referred to as the first source electrode T1s and the first drain electrode T1d), the source electrode and drain electrode of the driving transistor T2 (also referred to as the second source electrode T2s and the second drain electrode T2d), the source electrode and the drain electrode of the detection transistor T3 (also referred to as the third source electrode T3s and the third drain electrode T3d) and the third capacitor electrode CstE3 which are formed in each sub-pixel. As shown in FIG. 4 and FIG. 14, the first drain electrode T1d and the first source electrode T1s are electrically connected to the conductized ends of the first active layer T1a located on both sides of the first gate electrode T1g respectively through the first via hole V1 and the second via hole V2, so as to form the switching transistor T1. The second drain electrode T2d and the second source electrode T2s are electrically connected to the conductized ends of the second active layer T2a located on both sides of the second gate electrode T2g respectively through the third via V3 and the fourth via V4, so as to form the driving transistor T2. The second drain electrode T2d is further electrically connected to the first power connection line VDDLS through the third via hole V3. The third drain electrode T3d and the third source electrode T3s are electrically connected to the conductized ends of the third active layer T3a located on both sides of the third gate electrode T3g respectively through the fifth via hole V5 and the sixth via hole V6, so as to form the detection transistor T3. In addition, the third drain electrode T3d is further electrically connected to the detection connection line SLS through the eighth via hole V8, and the detection line SL is electrically connected to the detection connection line SLS through the seventh via hole, so that the detection line is electrically connected to the drain electrode T3d of the detection transistor T3 in each sub-pixel drive circuit. The first source electrode T1s is further electrically connected to the second gate electrode T2g and the second capacitor electrode CstE2 through the ninth via hole V9. The ninth via hole V9 may be understood as the first node G in FIG. 5. The third capacitor electrode CstE3 is electrically connected to the shielding layer 21 through the tenth via hole V10 and fills the fourteenth via hole V14. The third capacitor electrode CstE3 is electrically connected to the second source electrode T2s and the third source electrode T3s, and these three may be formed as an integral structure. The second power line VSSL is electrically connected to the first auxiliary line 62 through the plurality of eleventh via holes V11 so as to reduce the transmission resistance of the second power line VSSL. The first power line VDDL is electrically connected to the second auxiliary line 63 through the plurality of twelfth via holes V12 so as to reduce the transmission resistance of the first power line VDDL, and the VDD voltage signal is transmitted over the first power connection line VDDLS to the second drain electrode T2d of the driving transistor T2 through the second auxiliary line 63. As shown in FIG. 4, the pattern of the third metal layer 80 in the first sub-pixel drive circuit SPC1 and that in the fourth sub-pixel drive circuit SPC4 are approximately mirror-symmetrical with respect to the position of the detection line SL formed, and the pattern of the third metal layer 80 in the second sub-pixel drive circuit SPC2 and that in the third sub-pixel drive circuit SPC3 are approximately mirror-symmetrical with respect to the position of the detection line SL formed.

After this patterning process, the pattern of the third metal layer 80 is formed in the display area DA but not in the light-transmitting area TA. The light-transmitting area TA includes the base substrate 10, and the first insulating layer 30 and the third insulating layer provided on the base substrate 10.

Figure 15:
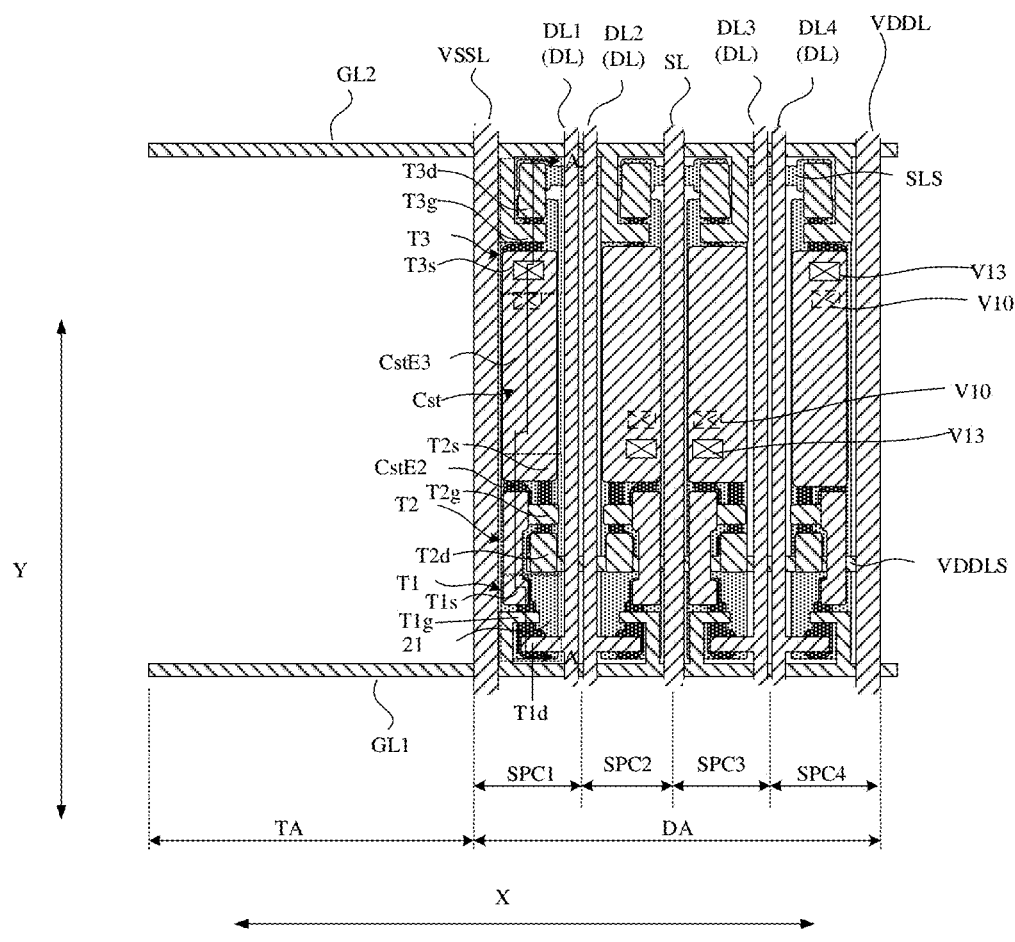
FIG. 15 shows a schematic plan view of the single pixel of the transparent display panel according to some embodiments of the present disclosure after patterns of a fourth insulating layer and a planarization layer are formed in the manufacturing process.
Figure 16:
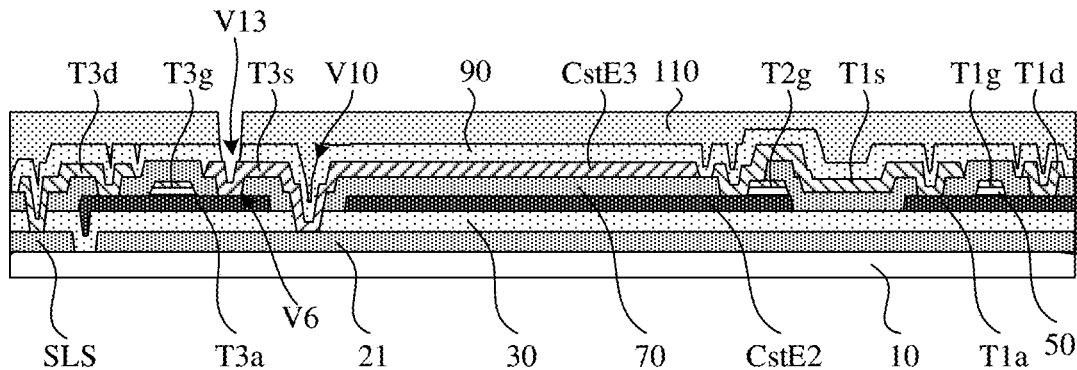
FIG. 16 shows a schematic cross-sectional view taken along line A-A in FIG. 15.

FIG. 15 shows a schematic plan view of the single pixel of the transparent display panel according to some embodiments of the present disclosure after patterns of a fourth insulating layer and a planarization layer are formed in the manufacturing process. FIG. 16 shows a schematic cross-sectional view taken along line A-A in FIG. 15. As shown in FIGS. 15 and 16, patterns of the fourth insulating layer 90 and the planarization layer 110 are then formed. Specifically, a fourth insulating film is first deposited on the base substrate 10 formed with the aforementioned patterns, and a patterning process such as exposure, development or etching is performed on the fourth insulating film to form the pattern of the fourth insulating layer 90. The pattern of the fourth insulating layer 90 has a via hole in each sub-pixel drive circuit. Then, a planarization film is applied to the base substrate 10 on which the pattern of the fourth insulating layer 90 is formed, and a patterning process such as exposure, development or etching is performed on the planarization film to form the pattern of the planarization layer 110. The pattern of the planarization layer 110 is only provided in the display area DA of the pixel P but not in the light-transmitting area TA. The pattern of the planarization layer 110 also has a via hole in each sub-pixel drive circuit. In each sub-pixel drive circuit, the via hole of the planarization layer 110 is aligned with the via hole of the fourth insulating layer 90, and the two form a thirteenth via hole V13 that penetrates the planarization layer 110 and the fourth insulating layer 90. A size of the thirteenth via V13 is obvious greater than that of the other via holes. In some embodiments, as shown in FIGS. 15 and 16, in the first sub-pixel drive circuit SPC1 and the fourth sub-pixel drive circuit SPC4, the thirteenth via hole V13 is located at the position where the source electrode T3s of the detection transistor T3 is located. Specifically, the thirteenth via hole V13 covers the sixth via hole V6, that is, an orthographic projection of the sixth via hole V6 on the base substrate 10 falls within an orthographic projection of the thirteenth via hole V13 on the base substrate 10. Therefore, the layout space may be saved, and the opening area of the pixel defining layer formed subsequently may be formed as large as possible. The fourth insulating layer 90 and the planarization layer 110 in the thirteenth via hole V13 are etched away, exposing the surface of the source electrode T3s of the detection transistor T3. In the second sub-pixel drive circuit SPC2 and the third sub-pixel drive circuit SPC3, the thirteenth via hole V13 is located at the position of the opening 43 of the second capacitor electrode CstE2 and is adjacent to the tenth via hole V10. In some embodiments, the thirteenth via hole V13 covers the fourteenth via hole V14, that is, an orthographic projection of the fourteenth via hole V14 on the base substrate 10 falls within the orthographic projection of the thirteenth via hole V13 on the base substrate 10. As a result, a sleeve hole structure similar to that in the first sub-pixel drive circuit SPC1 and the fourth sub-pixel drive circuit SPC4 is formed, which improves the process uniformity. The fourth insulating layer 90 and the planarization layer 110 in the thirteenth via hole V13 are etched away, exposing the surface of the third capacitor electrode CstE3. In each sub-pixel drive circuit, the thirteenth via hole V13 is adjacent to the tenth via hole V10, and is aligned with the tenth via hole V10 in the second direction Y, that is, a straight line connecting a center of the thirteenth via hole V13 and a center of the tenth via hole V10 is parallel to the second direction Y. In the first sub-pixel drive circuit SPC1 and the fourth sub-pixel drive circuit SPC4, the thirteenth via hole V13 is arranged closer to the second gate line GL2 than the tenth via hole V10. In the second sub-pixel drive circuit SPC2 and the third sub-pixel drive circuit SPC3, the thirteenth via hole V13 is arranged farther away from the second gate line GL2 than the tenth via hole V10. Those skilled in the art should understand that the tenth via hole V10 in each sub-pixel drive circuit should be shielded by the fourth insulating layer 90 and the planarization layer 110. However, in order to clearly reflect the positional relationship between the tenth via hole V10 and the thirteenth via hole V13, the tenth via hole V10 in each sub-pixel drive circuit is shown in a dotted pattern in FIG. 15. As shown in FIG. 15, the patterns of the fourth insulating layer 90 and the planarization layer 110 in the first sub-pixel drive circuit SPC1 and those in the fourth sub-pixel drive circuit SPC4 are approximately mirror-symmetrical with respect to the position of the detection line SL. The patterns of the fourth insulating layer 90 and the planarization layer 110 in the second sub-pixel drive circuit SPC2 and those in the third sub-pixel drive circuit SPC3 are approximately mirror-symmetrical with respect to the position of the detection line SL. After this patterning process, the light-transmitting area TA includes the first insulating layer 30, the third insulating layer 70 and the fourth insulating layer 90 stacked on the base substrate 10.

Figure 17:
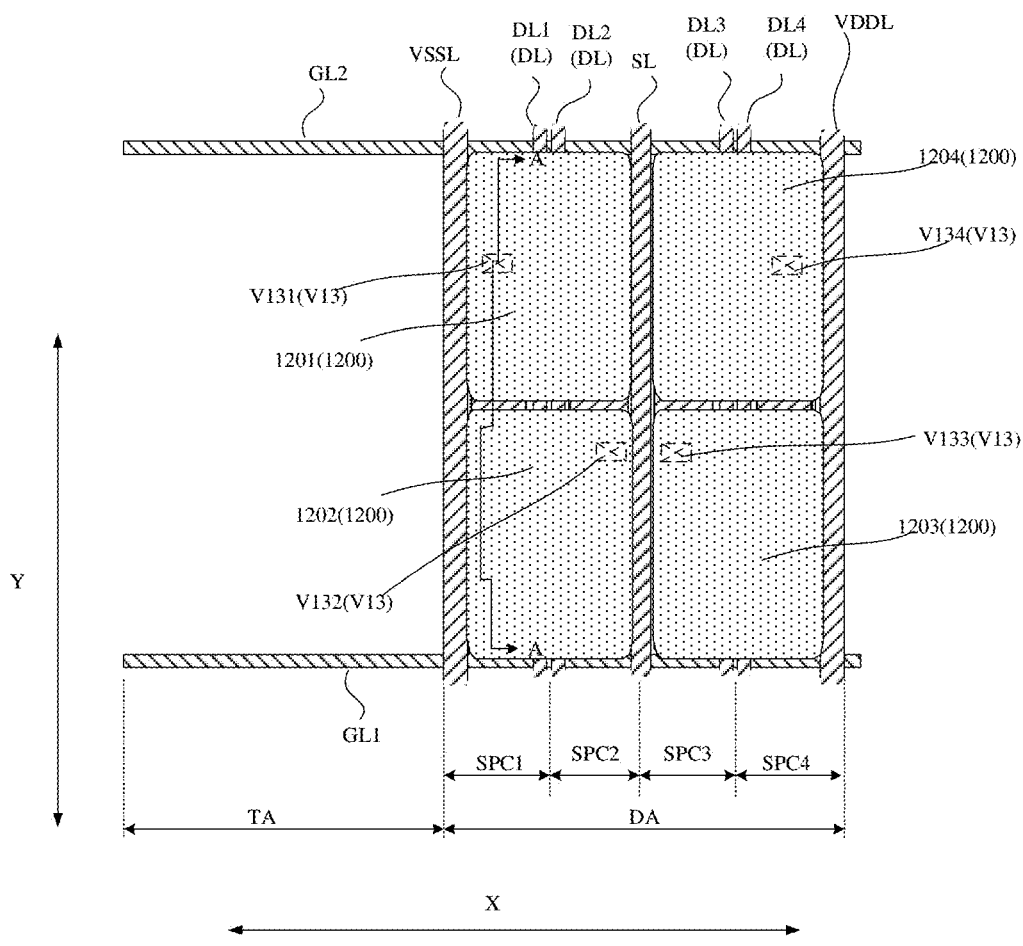
FIG. 17 shows a schematic plan view of the single pixel of the transparent display panel according to some embodiments of the present disclosure after a pattern of an anode layer is formed in the manufacturing process.
Figure 18:
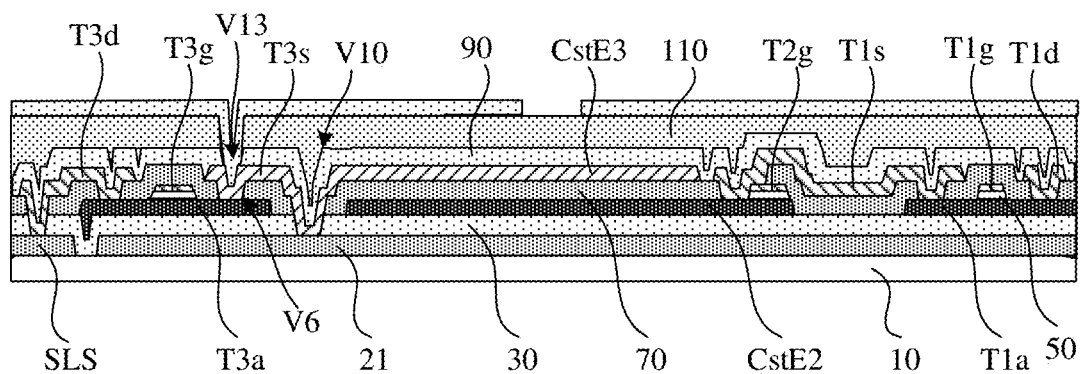
FIG. 18 shows a schematic cross-sectional view taken along line A-A in FIG. 17.

FIG. 17 shows a schematic plan view of the single pixel of the transparent display panel according to some embodiments of the present disclosure after a pattern of an anode layer is formed in the manufacturing process. FIG. 18 shows a schematic cross-sectional view taken along line A-A in FIG. 17. As shown in FIGS. 17 and 18, the pattern of the anode layer 120 is then formed. Specifically, a conductive film such as a stacked-layer structure of aluminum/ITO/aluminum is deposited on the base substrate formed with the aforementioned patterns and is patterned by a patterning process so as to form the pattern of the anode layer 20 on the planarization layer 110. The anode layer 120 at least includes an anode 1200 of the light-emitting element D of each sub-pixel, that is, a first anode 1201 of the first light-emitting element of the first sub-pixel, a second anode 1202 of the second light-emitting element of the second sub-pixel, a third anode 1203 of the third light-emitting element of the third sub-pixel, and a fourth anode 1204 of the fourth light-emitting element of the fourth sub-pixel. The source electrode T2s of the driving transistor T2, the source electrode T3s of the detection transistor T3 and the third capacitor electrode CstE3 in each sub-pixel drive circuit are connected to each other and formed as an integral structure. In each sub-pixel, the anode 1200 is electrically connected to the integral structure through the thirteenth via hole V13 in the corresponding sub-pixel drive circuit (also referred to as an anode via hole V13 in the present disclosure), so as to achieve an electrical connection between the anode 1200 of each sub-pixel and the source electrode T2s of the driving transistor T2 in the sub-pixel drive circuit. In FIG. 17, the thirteenth via hole V13 in each sub-pixel drive circuit should be shielded by the anode 1200. However, in order to clearly reflect the positional relationship between the thirteenth via hole V13 and the anode 1200, the thirteenth via hole V13 in each sub-pixel drive circuit is shown with a dotted pattern in FIG. 17. In some embodiments, the four anodes 1200 are all located in the display area DA. Each anode 1200 may be rectangular, and the four anodes 1200 are arranged in a 2×2 matrix in the display area DA. In some embodiments, as shown in FIGS. 17 and 18, the first anode 1201 is located at the upper left and is electrically connected to the source electrode T3s of the detection transistor T3 of the first sub-pixel drive circuit SPC1 through the thirteenth via hole V13 in the first sub-pixel drive circuit SPC1, the second anode 1202 is located at the lower left and is electrically connected to the third capacitor electrode CstE3 of the second sub-pixel drive circuit SPC2 through the thirteenth via hole V13 in the second sub-pixel drive circuit SPC2, the third anode 1203 is located at the lower right and is electrically connected to the third capacitor electrode CstE3 of the third sub-pixel drive circuit SPC3 through the thirteenth via hole V13 in the third sub-pixel drive circuit SPC3, and the fourth anode 1204 is located at the upper right and is electrically connected to the source electrode T3s of the detection transistor T3 of the fourth sub-pixel drive circuit SPC4 through the thirteenth via hole V13 in the fourth sub-pixel drive circuit SPC4.

In some possible embodiments, the arrangement of the anodes 1200 in the display area DA may be adjusted according to actual needs, which is not specifically limited in the present disclosure. The anode layer 120 is usually not arranged in the light-transmitting area TA, so as to ensure the light transmittance of the light-transmitting area TA. After this patterning process, the film structure of the light-transmitting area TA is unchanged.

Figure 19:
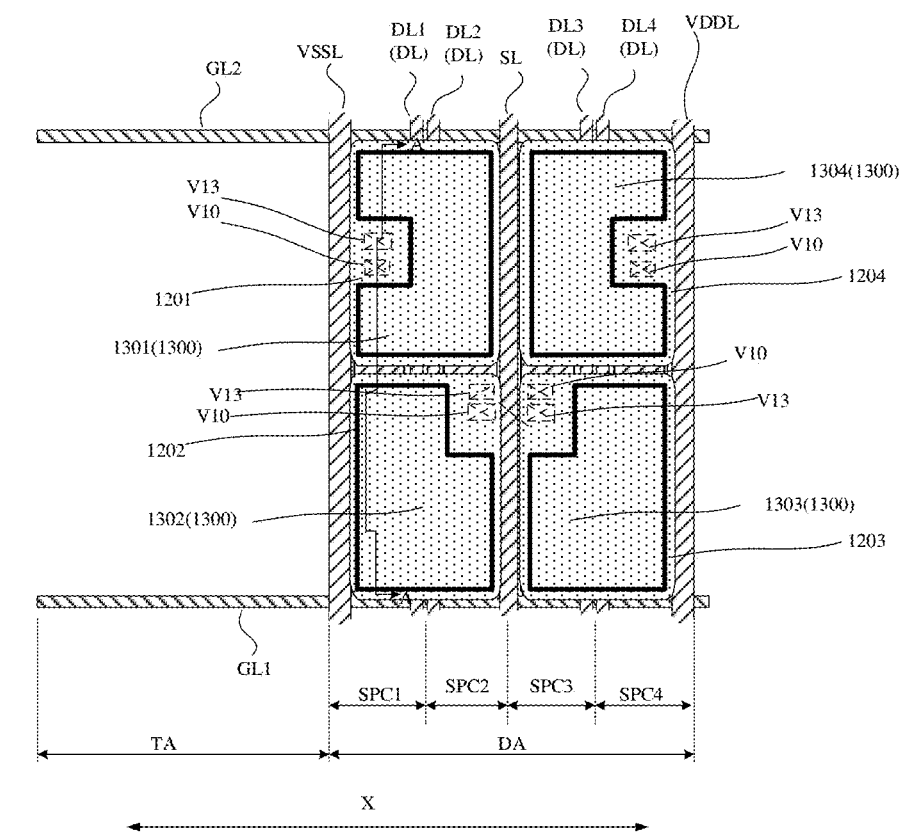
FIG. 19 shows a schematic plan view of the single pixel of the transparent display panel according to some embodiments of the present disclosure after patterns of a pixel defining layer, a luminescent material layer, a cathode and a packaging layer are formed in the manufacturing process.
Figure 20:
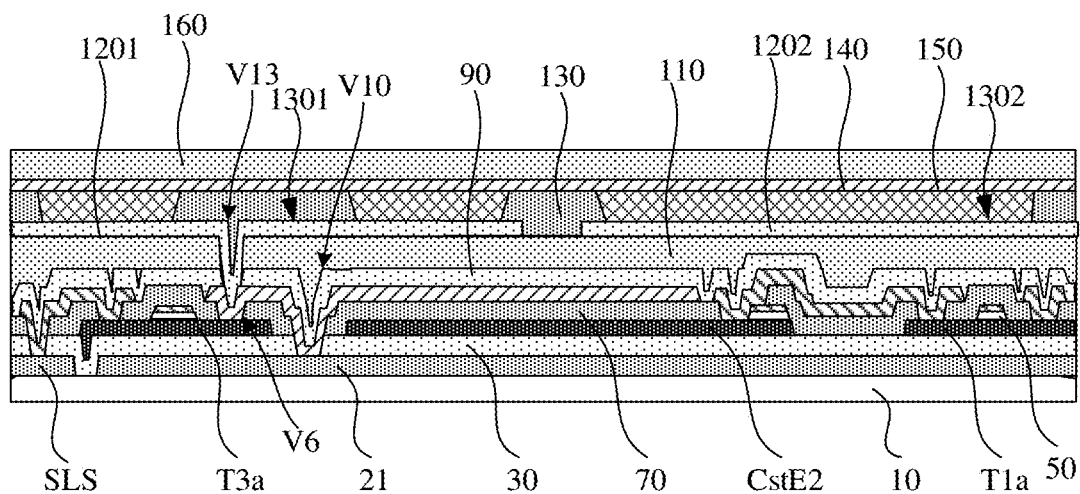
FIG. 20 shows a schematic cross-sectional view taken along line A-A in FIG. 19.

FIG. 19 shows a schematic plan view of the single pixel of the transparent display panel according to some embodiments of the present disclosure after patterns of a pixel defining layer, a luminescent material layer, a cathode and a packaging layer are formed in the manufacturing process. FIG. 20 shows a schematic cross-sectional view taken along line A-A in FIG. 19. For the sake of clarity, the patterns of the pixel defining layer, the luminescent material layer, the cathode and the packaging layer are omitted in FIG. 19, and only the opening of the pixel defining layer is shown. The pixel defining layer, the luminescent material layer, the cathode and the packaging layer are embodied in FIG. 20. As shown in FIGS. 19 and 20, the patterns of the pixel defining layer, the luminescent material layer, the cathode and the packaging layer are formed. Specifically, a pixel defining film layer is applied to the base substrate 10 formed with the aforementioned patterns, and the pattern of the pixel defining layer 130 is formed by a process such as mask, exposure or development. The pixel defining layer 130 has openings 1300 corresponding to the anodes 1200 of the sub-pixels, that is, a first opening 1301, a second opening 1302, a third opening 1303 and a fourth opening 1304 respectively corresponding to the first anode 1201, the second anode 1202, the third anode 1203 and the fourth anode 1204. The first opening 1301, the second opening 1302, the third opening 1303 and the fourth opening 1304 respectively define the light-emitting areas of the first light-emitting element, the second light-emitting element, the third light-emitting element and the fourth light-emitting element. An orthographic projection of each opening 1300 on the base substrate 10 falls within the orthographic projection of its corresponding anode 1200 on the base substrate, and each opening 1300 exposes a portion of its corresponding anode 1200. Subsequently, in some embodiments, a luminescent material layer 140 is formed in the above-mentioned opening 1300 and is electrically connected to the corresponding anode 1200. Optionally, in other embodiments, the luminescent material layer 140 is vapor-deposited substantially on the entire upper surface of the base substrate 10 after the pixel defining layer 130 with the opening 1300 is formed, and the luminescent material layer 140 located in the opening 1300 corresponds to the light-emitting area of each sub-pixel. Subsequently, a cathode film is deposited, and a pattern of the cathode layer 150 is formed by a patterning process. The cathode layer 150 includes at least the cathode of the light-emitting element D of each sub-pixel. The cathode layer 150 is electrically connected to the light-emitting material layer 140 and the second power line VSSL. In some embodiments, as shown in FIGS. 19 and 20, the cathodes of the light-emitting elements D of the sub-pixels are formed as an integral structure. In some embodiments, the cathodes of the light-emitting elements D of the sub-pixels of the plurality of pixels P are all integrally formed and cover the light-transmitting areas TA and the display areas DA of the plurality of pixels P. Subsequently, the packaging layer 160 is formed on the cathode layer 150. The packaging layer 160 may be, for example, a stacked layer structure including an inorganic material/organic material/inorganic material. In some embodiments, the cathode layer 150 may be electrically connected to the second power line VSSL in various ways, such as laser drilling. In some embodiments, the cathode layer 150 may be electrically connected to the second power line VSSL through via holes. In the via holes, the anode layer may be used to form a connection electrode to electrically connect the second power line VSSL and the cathode. In some embodiments, the cathode 150 substantially covers the entire surface of the base substrate 10. Peripheral wirings are provided in the peripheral area of the display panel, and the peripheral wirings also receive the VSS voltage signal. In the peripheral area of the display panel, the cathode layer 150 is also electrically connected to the peripheral wirings. After this process, in some embodiments, the light-transmitting area TA may include the base substrate 10, and the first insulating layer 30, the third insulating layer 70, the fourth insulating layer 90, the cathode layer 150 and the packaging layer 160 provided on the base substrate 10. Those skilled in the art may understand that the first insulating layer 30, the third insulating layer 70, the fourth insulating layer 90, the cathode layer 150 and the packaging layer 160 in the light-transmitting area TA are not necessary. In some embodiments, the above-mentioned layers in the light-transmitting area TA may be removed in the formation process of these layers according to actual needs.

Then, the pixel structure of the transparent display panel has been basically completed. As shown in FIGS. 4 and 10, in each of the first sub-pixel drive circuit SPC1, the second sub-pixel drive circuit SPC2, the third sub-pixel drive circuit SPC3 and the fourth sub-pixel drive circuit SPC4, in the second direction Y, the storage capacitor Cst is basically located in the middle of the sub-pixel drive circuit, the switching transistor T1 and the detection transistor T3 are respectively located on both sides of the storage capacitor Cst, the first gate line GL1 is located on the side of the switching transistor T1 away from the storage capacitor Cst, and the second gate line GL2 is located on the side of the detection transistor T3 away from the storage capacitor Cst. Between the two ends of the single pixel along the first direction X, the first gate line GL1 and the second gate line GL2 both extend straight in the first direction, and are located on both sides of the pixel P including the light-transmitting area TA and the display area DA. Therefore, while ensuring the size of the light-transmitting area, the problem of increased transmission impedance caused by the bending of the gate line is avoided.

Specifically, as shown in FIGS. 4 and 10, for each of the first sub-pixel drive circuit SPC1, the second sub-pixel drive circuit SPC2, the third sub-pixel drive circuit SPC3 and the fourth sub-pixel drive circuit SPC4, the switching transistor T1 is located in the portion of the sub-pixel drive circuit close to the first gate line GL1, and the first drain electrode T1d, the first gate electrode T1g and the first source electrode T1s of the switching transistor T1 are arranged sequentially away from the first gate line GL1 in the second direction Y. The first gate electrode T1g extending in the first direction X is electrically connected to the first gate line GL1 through the first gate connection line 64 extending in the second direction Y. Specifically, the first gate electrode T1g includes a connection end T1g1 and a free end T1g2, and the first gate connection line 64 includes a first end 641 and a second end 642. The first end 641 of the first gate connection line 64 is electrically connected to the first gate line GL1, and the second end 642 of the first gate connection line 64 is electrically connected to the connection end T1g1 of the first gate electrode T1g. In some embodiments, the first gate electrode T1g, the first gate connection line 64 and the first gate line GL1 are formed as an integral structure. By introducing the first gate connecting line 64 to connect the first gate line GL1 and the first T1G, the design avoids the bending of the first gate line GL1 directly passing between the first drain electrode T1d and the first source electrode T1s, which avoids the increased transmission impedance caused by the bending of the gate line while ensuring the size of the light-transmitting area.

As shown in FIGS. 4 and 10, in the first sub-pixel drive circuit SPC1, the free end T1g2 of the first gate electrode T1g is closer to the first data line DL1 than the connection end T1g1, and the first drain electrode T1d is closer to the first data line DL1 than the first gate connection line 64, so that the first gate connection line 64 extending in the second direction Y has no overlapping area with the first drain electrode T1d connected to the first data line DL1, thereby avoiding signal crosstalk.

In the second sub-pixel drive circuit SPC2, the free end T1g2 of the first gate electrode T1g is closer to the second data line DL2 than the connection end T1g1, and the first drain electrode T1d is closer to the second data line DL2 than the first gate connection line 64, so that the first gate connection line 64 extending in the second direction Y has no overlapping area with the first drain electrode T1d connected to the second data line DL2, thereby avoiding signal crosstalk.

In the third sub-pixel drive circuit SPC3, the free end T1g2 of the first gate electrode T1g is closer to the third data line DL3 than the connection end T1g1, and the first drain electrode T1d is closer to the third data line DL3 than the first gate connection line 64, so that the first gate connection line 64 extending in the second direction Y has no overlapping area with the first drain electrode T1d connected to the third data line DL2, thereby avoiding signal crosstalk.

In the fourth sub-pixel drive circuit SPC4, the free end T1g2 of the first gate electrode T1g is closer to the fourth data line DL4 than the connection end T1g1, and the first drain electrode T1d is closer to the fourth data line DL4 than the first gate connection line 64, so that the first gate connection line 64 extending in the second direction Y has no overlapping area with the first drain electrode T1d connected to the fourth data line DL2, thereby avoiding signal crosstalk.

In some embodiments, as shown in FIGS. 4 and 10, for each of the first sub-pixel drive circuit SPC1, the second sub-pixel drive circuit SPC2, the third sub-pixel drive circuit SPC3 and the fourth sub-pixel drive circuit SPC4, the switching transistor T1 is located in the portion of the sub-pixel drive circuit close to the second gate line GL1, and the third drain electrode T3d, the third gate electrode T3g and the third source electrode T3s of the detection transistor T1 are arranged sequentially away from the second gate line GL2 along the second direction Y. The third gate electrode T3g extending in the first direction X is electrically connected to the second gate line GL2 through the second gate connection line 65 extending in the second direction Y. Specifically, the third gate electrode T3g includes a connection end T3g1 and a free end T3g2, and the second gate connection line 65 includes a first end 651 and a second end 652. The first end 651 of the second gate connection line 65 is electrically connected to the second gate line GL1, and the second end 652 of the second gate connection line 65 is electrically connected to the connection end T3g1 of the third gate electrode T3g. In some embodiments, the third gate electrode T3g, the second gate connection line 65 and the second gate line GL2 are formed as an integral structure. By introducing the second gate connection line 65 to connect the second gate line GL2 and the second gate electrode T3g, the design avoids the bending of the second gate line GL2 directly passing between the third drain electrode T3d and the third source electrode T3s, which avoids the increased transmission impedance caused by the bending of the gate line while ensuring the size of the light-transmitting area.

As shown in FIGS. 4 and 10, in the first sub-pixel drive circuit SPC1, the free end T3g2 of the third gate electrode T3g is closer to the detection line SL1 than the connection end T3g1, and the third drain electrode T3d is closer to the detection line SL than the second gate connection line 65, so that the second gate connection line 65 extending in the second direction Y has no overlapping area with the detection connection line SLS connected to the third drain electrode T3d and the detection line SL, thereby avoiding signal crosstalk.

In the second sub-pixel drive circuit SPC2, the free end T3g2 of the third gate electrode T3g is closer to the detection line SL than the connection end T3g1, and the third drain electrode T3d is closer to the detection line SL than the second gate connection line 65, so that the second gate connection line 65 extending in the second direction Y is relatively away from the detection line SL, thereby avoiding signal crosstalk.

In the third sub-pixel drive circuit SPC3, the free end T3g2 of the third gate electrode T3g is closer to the detection line SL than the connection end T3g1, and the third drain electrode T3d is closer to the detection line SL than the second gate connection line 65, so that the second gate connection line 65 extending in the second direction Y is relatively far away from the detection line SL, thereby avoiding signal crosstalk.

In the fourth sub-pixel drive circuit SPC4, the free end T3g2 of the third gate electrode T3g is closer to the detection line SL than the connection end T3g1, and the third drain electrode T3d is closer to the detection line SL than the second gate connection line 65, so that the second gate connection line 65 extending in the second direction Y has no overlapping area with the detection connection line SLS connected to the third drain electrode T3d and the detection line SL, thereby avoiding signal crosstalk.

In some embodiments, as shown in FIGS. 4 and 10, in each sub-pixel drive circuit, an orthographic projection of a center line of the sub-pixel drive circuit in the second direction Y on the base substrate 10 intersects the orthographic projection of the first gate electrode T1g of the switching transistor T1 on the base substrate 10, and also intersects the orthographic projection of the third gate electrode T3g of the detection transistor T3 on the base substrate 10.

In the first sub-pixel drive circuit SPC1, the first gate connection line 64 and the second gate line connection line 65 are both located at an edge of the first sub-pixel drive circuit SPC1 close to the second power line VSSL, that is, the first gate connection line 64 and the second gate line connection line 65 are both located on one side of the center line of the first sub-pixel drive circuit SPC1 in the second direction Y, for example, on the side close to the second power line VSSL.

In the second sub-pixel drive circuit SPC2, the first gate connection line 64 is located at an edge of the second sub-pixel drive circuit SPC2 close to the first power line VDDL, and the second gate line connection line 65 is located at an edge of the second sub-pixel drive circuit SPC2 close to the second power line VSSL, that is, the first gate connection line 64 and the second gate line connection line 65 are respectively located on both sides of the center line of the second sub-pixel drive circuit SPC2 in the second direction Y.

In the third sub-pixel drive circuit SPC3, the first gate connection line 64 is located at an edge of the third sub-pixel drive circuit SPC3 close to the second power line VSSL, and the second gate line connection line 65 is located at an edge of the third sub-pixel drive circuit SPC3 close to the first power line VDDL, that is, the first gate connection line 64 and the second gate line connection line 65 are respectively located on both sides of the center line of the third sub-pixel drive circuit SPC3 in the second direction Y.

In the fourth sub-pixel drive circuit SPC4, the first gate connection line 64 and the second gate line connection line 65 are both located at an edge of the fourth sub-pixel drive circuit SPC4 close to the first power line VDDL, that is, the first gate connection line 64 and the second gate line connection line 65 are both located on one side of the center line of the fourth sub-pixel drive circuit SPC1 in the second direction Y, for example, on the side close to the first power line VDDL.

In some embodiments, as shown in FIGS. 4 and 10, in each sub-pixel drive circuit, the detection connection line SLS is provided passing between the detection transistor T3 and the second gate line GL2. Therefore, a distance between the third gate electrode T3g of the detection transistor T3 and the second gate line GL2 is greater than a distance between the first gate electrode T1g of the detection transistor T1 and the first gate line GL1. In other words, in each sub-pixel drive circuit, the second gate connection line 65 has a length greater than that of the first gate connection line.

In some embodiments, as shown in FIGS. 4 and 10, the first gate electrode T1g of the switching transistor T1 of each sub-pixel drive circuit extends in the first direction X, and a distance from each first gate electrode T1g to the first gate line GL1 is substantially the same. That is, the first gate electrodes T1g of the switching transistors T1 of the sub-pixel drive circuits are approximately located on the same straight line which is parallel to the first gate line GL1. The first gate electrode T3g of the switching transistor T3 of each sub-pixel drive circuit extends in the first direction X, and a distance from each third gate electrode T3g to the second gate line GL2 is substantially the same. That is, the third gate electrodes T3g of the switching transistors T3 of the sub-pixel drive circuits are approximately located on the same straight line which is parallel to the second gate line GL2.

In some embodiments, the light-transmitting area TA of the pixel P is surrounded by the corresponding first gate line GL1, second gate line GL2 and second power line VSSL, and the first power line VDDL corresponding to another pixel P adjacent to the pixel P.

Some embodiments of the present disclosure provide an electronic device, specifically a transparent electronic device, including the transparent display panel described in any of the aforementioned embodiments. The transparent electronic device may be applied to perspective windows, vehicle windows and other products or components with perspective and display functions.

The above descriptions are only preferred embodiments of the present disclosure and explanations of the technical principles applied. Those skilled in the art should understand that the scope of the invention involved in the present disclosure is not limited to the technical solutions formed by the specific combination of the above technical features, and should also cover other technical solutions formed by any combination of the above technical features or their equivalent features without departing from the inventive concept, for example, the technical features formed by mutual replacements of the above-mentioned features and the technical features with similar functions disclosed in the present disclosure (but not limited thereto).

The invention claimed is:

1. A display panel, comprising:
a base substrate; and
a pixel arranged on the base substrate, comprising a light-transmitting area and a display area arranged side by side in a first direction parallel to the base substrate, wherein the pixel comprises a plurality of sub-pixel drive circuits sequentially arranged in the first direction in the display area, each of the sub-pixel drive circuits comprises a switching transistor, a detection transistor and a storage capacitor, the switching transistor and the detection transistor are respectively located on both sides of the storage capacitor in a second direction perpendicular to the first direction and parallel to the base substrate;
a first gate line configured to provide a first scanning signal to the plurality of sub-pixel drive circuits; and a second gate line configured to provide a second scanning signal to the plurality of sub-pixel drive circuits,
wherein the first gate line and the second gate line are respectively located on both sides of the light-transmitting area, the first gate line is located on a side of the switching transistor away from the storage capacitor, the second gate line is located on a side of the detection transistor away from the storage capacitor, and between two ends of the pixel in the first direction, at least one of the first gate line and the second gate line is linear and extends in the first direction.

2. The display panel according to claim 1, wherein the switching transistor is located in a region of the corresponding sub-pixel drive circuit close to the first gate line and comprises a drain electrode, a gate electrode and a source electrode arranged sequentially away from the first gate line in the second direction, the first gate line is electrically connected to the gate electrode of the switching transistor, and between the two ends of the pixel in the first direction, the first gate line is linear and extends in the first direction.

3. The display panel according to claim 2, wherein the gate electrode of the switching transistor extends in the first direction and comprises a connection end and a free end, each of the plurality of sub-pixel drive circuits further comprises a first gate connection line extending in the second direction, the first gate connection line comprises a first end electrically connected to the first gate line and a second end electrically connected to the connection end of the gate electrode of the switching transistor.

4. The display panel according to claim 3, wherein the gate electrode of the switching transistor, the first gate connection line and the first gate line are formed as an integral structure.

5. The display panel according to claim 3, wherein the plurality of sub-pixel drive circuits comprise a first sub-pixel drive circuit, a second sub-pixel drive circuit, a third sub-pixel drive circuit and a fourth sub-pixel drive circuit sequentially arranged in the first direction;
wherein the display panel further comprises a first data line, a second data line, a third data line and a fourth data line extending in the second direction; the first data line is arranged on a side of the first sub-pixel drive circuit close to the second sub-pixel drive circuit and is configured to provide a first data signal to the first sub-pixel drive circuit; the second data line is arranged on a side of the second sub-pixel drive circuit close to the first sub-pixel drive circuit and is configured to provide a second data signal to the second sub-pixel drive circuit; the third data line is arranged on a side of the third sub-pixel drive circuit close to the fourth sub-pixel drive circuit and is configured to provide a third data signal to the third sub-pixel drive circuit; and the fourth data line is arranged on a side of the fourth sub-pixel drive circuit close to the third sub-pixel drive circuit and is configured to provide a fourth data signal to the four sub-pixel drive circuit.

6. The display panel according to claim 5, wherein the free end of the gate electrode of the switching transistor of the first sub-pixel drive circuit is closer to the first data line than the connection end thereof; and the drain electrode of the switching transistor of the first sub-pixel drive circuit is electrically connected to the first data line and is closer to the first data line than the first gate connection line of the first sub-pixel drive circuit.

7. The display panel according to claim 5, wherein the free end of the gate electrode of the switching transistor of the second sub-pixel drive circuit is closer to the second data line than the connection end thereof; and the drain electrode of the switching transistor of the second sub-pixel drive circuit is electrically connected to the second data line and is closer to the second data line than the first gate connection line of the second sub-pixel drive circuit.

8. The display panel according to claim 5, wherein the free end of the gate electrode of the switching transistor of the third sub-pixel drive circuit is closer to the third data line than the connection end thereof; and the drain electrode of the switching transistor of the third sub-pixel drive circuit is electrically connected to the third data line and is closer to the third data line than the first gate connection line of the third sub-pixel drive circuit.

9. The display panel according to claim 5, wherein the free end of the gate electrode of the switching transistor of the fourth sub-pixel drive circuit is closer to the fourth data line than the connection end thereof; and the drain electrode of the switching transistor of the fourth sub-pixel drive circuit is electrically connected to the fourth data line and is closer to the fourth data line than the first gate connection line of the fourth sub-pixel drive circuit.

10. The display panel according to claim 3, wherein the detection transistor is located in a region of the corresponding sub-pixel drive circuit close to the second gate line and comprises a drain electrode, a gate electrode and a source electrode arranged sequentially away from the second gate line in the second direction; and
wherein the second gate line is electrically connected to the gate electrode of the detection transistor, and between the two ends of the pixel in the first direction, the second gate line is linear and extends in the first direction.

11. The display panel according to claim 10, wherein the gate electrode of the detection transistor extends in the first direction and comprises a connection end and a free end, each of the plurality of sub-pixel drive circuits further comprises a second gate connection line extending in the second direction, and the second gate connection line comprises a first end electrically connected to the second gate line and a second end electrically connected to the connection end of the gate electrode of the detection transistor.

12. The display panel according to claim 11, wherein the gate electrode of the detection transistor, the second gate connection line and the second gate line are formed as an integral structure.

13. The display panel according to claim 12, wherein the plurality of sub-pixel drive circuits comprises a first sub-pixel drive circuit, a second sub-pixel drive circuit, a third sub-pixel drive circuit and a fourth sub-pixel drive circuit sequentially arranged in the first direction; and
wherein the display panel further comprises a detection line extending in the second direction and a detection connection line extending in the first direction; the detection line is located between the second sub-pixel drive circuit and the third sub-pixel drive circuit, and the second sub-pixel drive circuit is electrically connected to the drain electrode of the detection transistor of each of the sub-pixel drive circuits through the detection connection line.

14. The display panel according to claim 13, wherein the free end of the gate electrode of the detection transistor of the first sub-pixel drive circuit is closer to the detection line than the connection end thereof; and the drain electrode of the detection transistor of the first sub-pixel drive circuit is closer to the detection line than the second gate connection line of the first sub-pixel drive circuit; or wherein the free end of the gate electrode of the detection transistor of the second sub-pixel drive circuit is closer to the detection line than the connection end thereof; and the drain electrode of the detection transistor of the second sub-pixel drive circuit is closer to the detection line than the second gate connection line of the second sub-pixel drive circuit; or wherein the free end of the gate electrode of the detection transistor of the third sub-pixel drive circuit is closer to the detection line than the connection end thereof; and the drain electrode of the detection transistor of the third sub-pixel drive circuit is closer to the detection line than the second gate connection line of the third sub-pixel drive circuit; or wherein the free end of the gate electrode of the detection transistor of the fourth sub-pixel drive circuit is closer to the detection line than the connection end thereof; and the drain electrode of the detection transistor of the fourth sub-pixel drive circuit is closer to the detection line than the second gate connection line of the fourth sub-pixel drive circuit.

15. The display panel according to claim 13, wherein the first sub-pixel drive circuit, the second sub-pixel drive circuit, the third sub-pixel drive circuit and the fourth sub-pixel drive circuit are arranged sequentially away from the light-transmitting area;

wherein the display panel further comprises a first power line and a second power line extending in the second direction; and wherein the first power line is located on a side of the fourth sub-pixel drive circuit away from the light-transmitting area, and the second power line is located on a side of the first sub-pixel drive circuit close to the light-transmitting area.

16. The display panel according to claim 15, wherein, in the first sub-pixel drive circuit, the first gate connection line and the second gate connection line are both located at an edge of the first sub-pixel drive circuit close to the second power line; or wherein, in the second sub-pixel derive circuit, the first gate connection line is located at an edge of the second sub-pixel drive circuit close to the first power line, and the second gate connection line is located at an edge of the second sub-pixel drive circuit close to the second power line; or wherein, in the third sub-pixel drive circuit, the first gate connection line is located at an edge of the third sub-pixel drive circuit close to the second power line, and the second gate connection line is located at an edge of the third sub-pixel drive circuit close to the first power line; or wherein, in the fourth sub-pixel drive circuit, the first gate connection line and the second gate connection line are both located at an edge of the fourth sub-pixel drive circuit close to the first power line.

17. The display panel according to claim 15, wherein the light-transmitting area is surrounded by the first gate line, the second gate line, the second power line, and a first power line corresponding to another pixel adjacent to the pixel.

18. The display panel according to claim 10, wherein, in each of the sub-pixel drive circuits, the first gate connection line has a length smaller than a length of the second gate connection line.

19. An electronic device, comprising the display panel according to claim 1.

* * * * *